United States Patent
Ishida et al.

(10) Patent No.: US 7,213,090 B2
(45) Date of Patent: May 1, 2007

(54) DATA TRANSFER APPARATUS FOR SERIAL DATA TRANSFER IN SYSTEM LSI

(75) Inventors: Yoichiro Ishida, Osaka (JP); Mitsuhiro Imaizumi, Osaka (JP); Chie Toyoshima, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 219 days.

(21) Appl. No.: 10/926,103

(22) Filed: Aug. 26, 2004

(65) Prior Publication Data
US 2005/0062501 A1    Mar. 24, 2005

(30) Foreign Application Priority Data
Sep. 2, 2003    (JP) .......................... P2003-310460

(51) Int. Cl.
*G06F 13/12* (2006.01)
(52) U.S. Cl. ....................... 710/71; 341/101
(58) Field of Classification Search ............... 340/101; 710/66, 71; 341/101
See application file for complete search history.

(56) References Cited

U.S. PATENT DOCUMENTS

| | | | |
|---|---|---|---|
| 5,195,055 A * | 3/1993 | Mizuoka et al. ............... | 365/78 |
| 5,507,001 A | 4/1996 | Nishizawa | |
| 6,182,175 B1 | 1/2001 | Nihouran | |
| 6,266,710 B1 | 7/2001 | Dittmer et al. | |
| 6,766,505 B1 * | 7/2004 | Rangan et al. ................ | 716/16 |
| 6,977,981 B2 * | 12/2005 | Measor ....................... | 375/362 |

* cited by examiner

*Primary Examiner*—Mark H. Rinehart
*Assistant Examiner*—Clifford Knoll
(74) *Attorney, Agent, or Firm*—McDermott Will & Emery LLP

(57) ABSTRACT

A data transfer apparatus comprises a plurality of selectors each having two inputs and an output, and a transfer gate gating the transfer of data, wherein one inputs of the plurality of selectors are connected to respective bits of a data bus in the order that transfer bits are arranged, while the other inputs thereof are connected to the outputs of the other selectors in the order, the transfer gate is connected to the output of the final-stage selector of the plurality of selectors, data of the respective corresponding bits of the data bus is set in the respective plurality of selectors when a transmission enable signal is in a negated state, and when the transmission enable signal is arranged to be in an asserted state, the plurality of selectors and the transfer gate are connected so as to serially transfer the data, and the set data is serially transferred in the connecting state by means of a delayed action resulting from an inter-selector delay time.

14 Claims, 17 Drawing Sheets

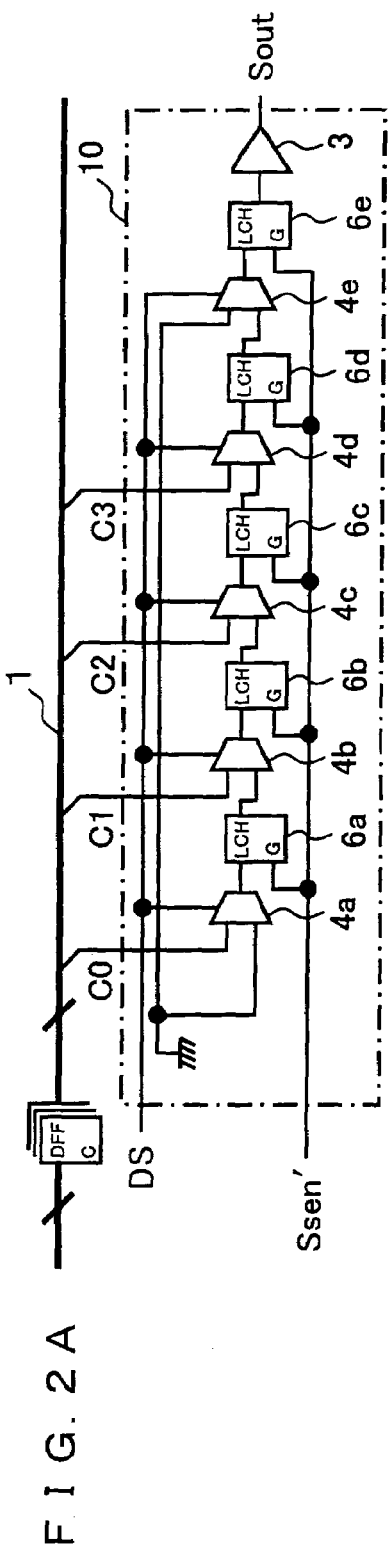
F I G. 2 A
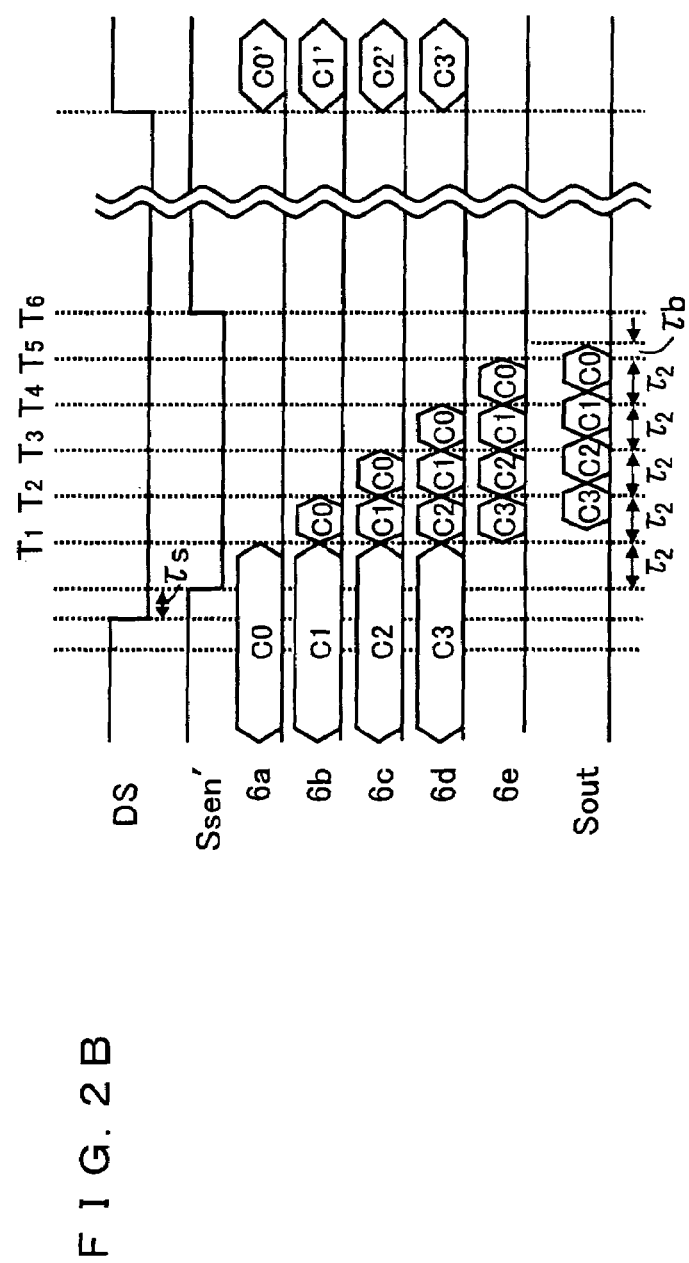
F I G. 2 B

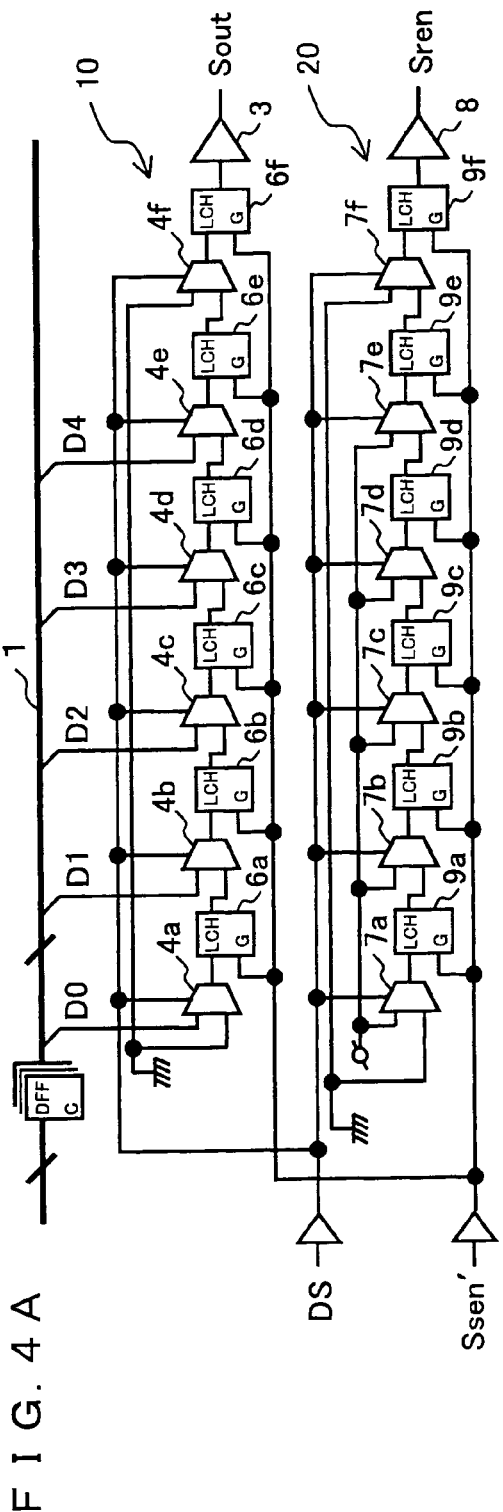
F I G. 4 A
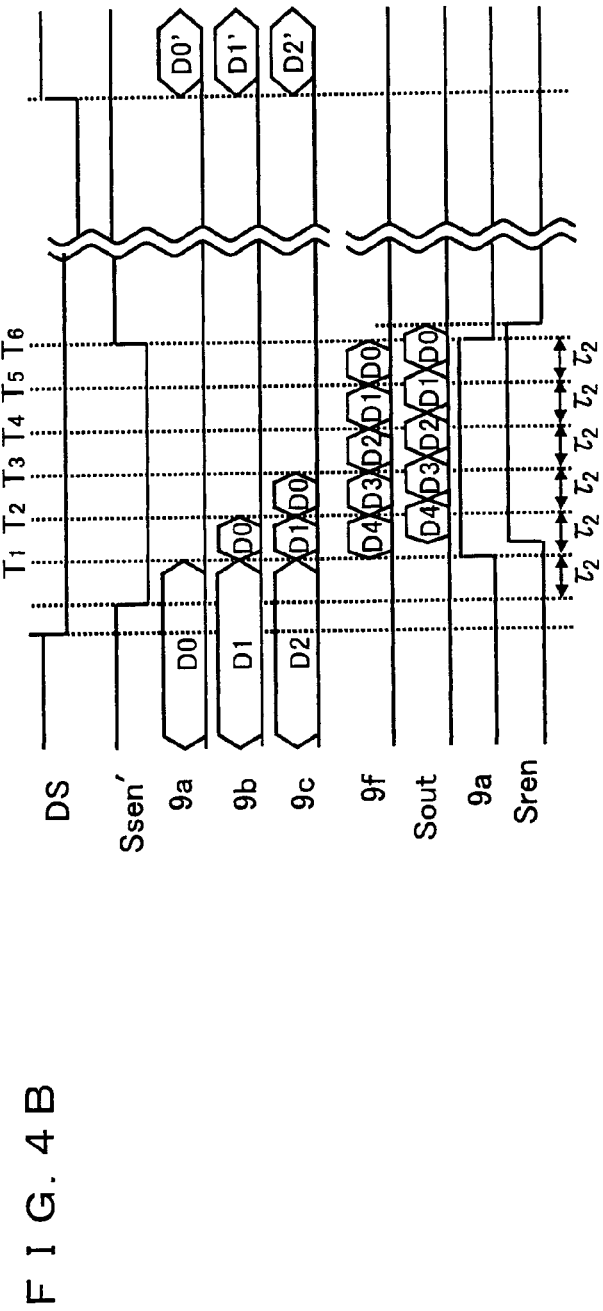
F I G. 4 B

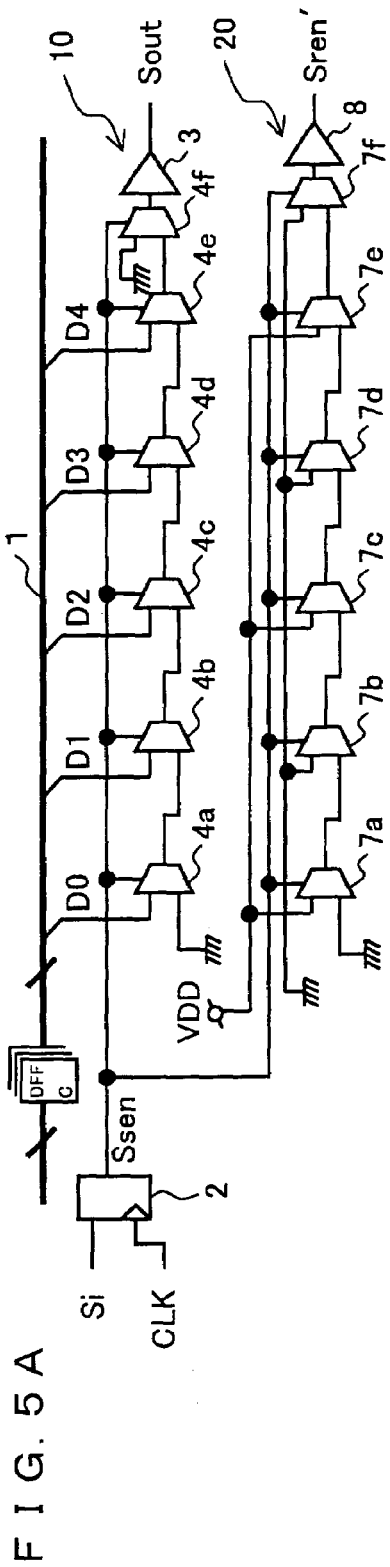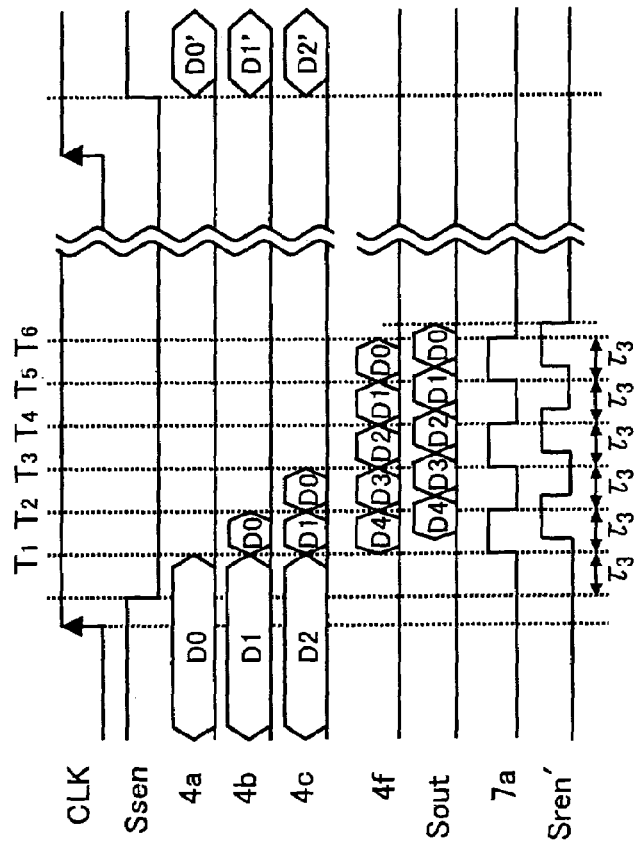
F I G. 5 A
F I G. 5 B

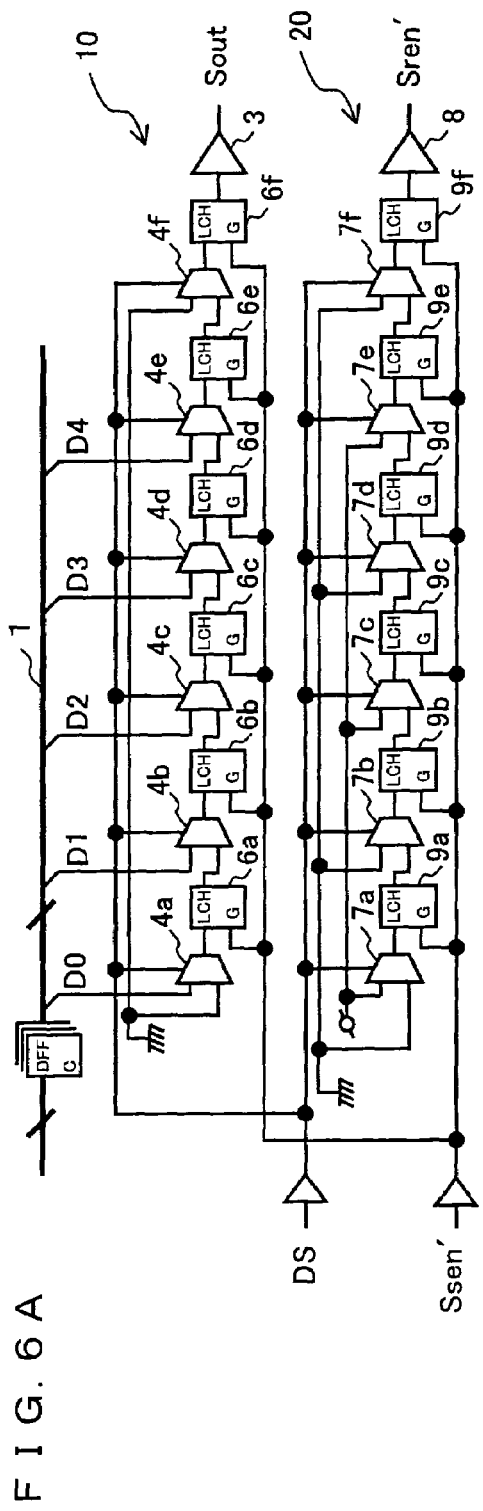
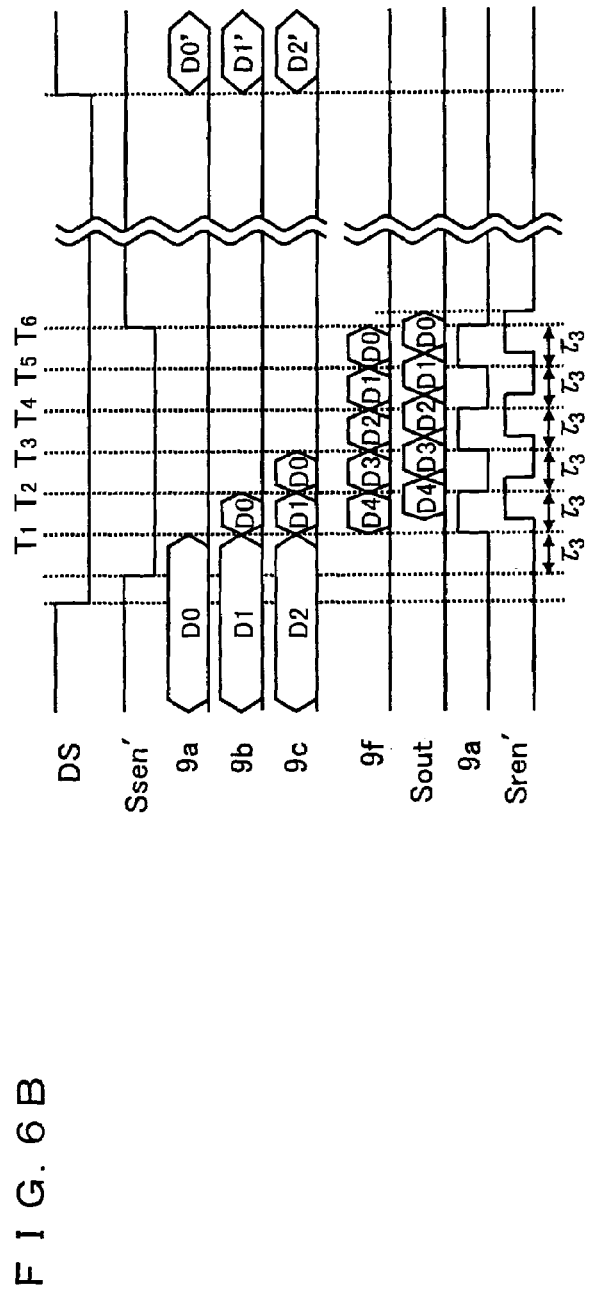
F I G. 6A
F I G. 6B

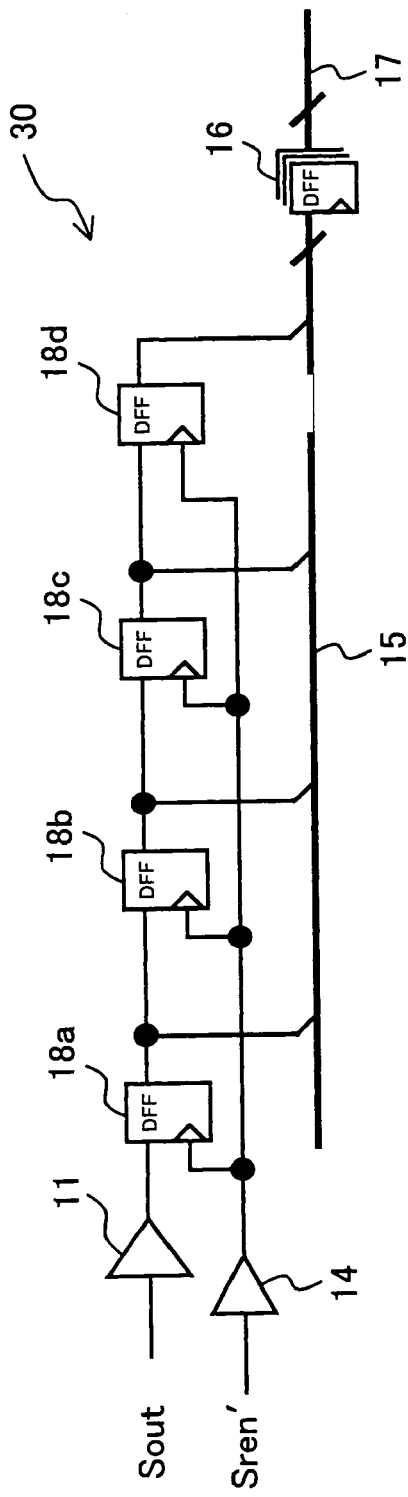
F I G. 8A
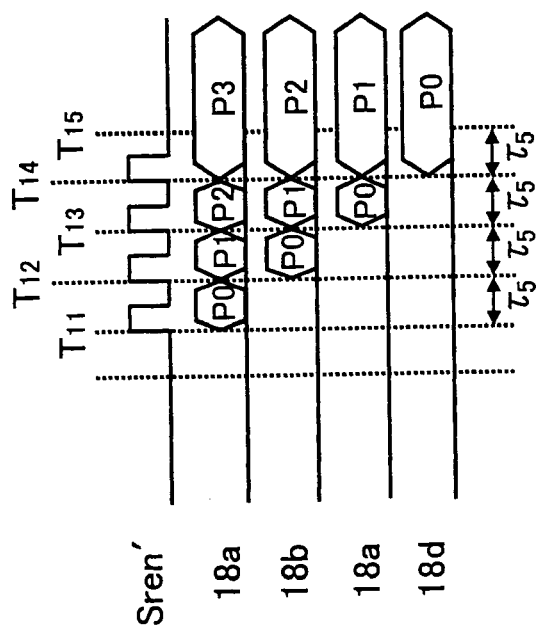
F I G. 8B

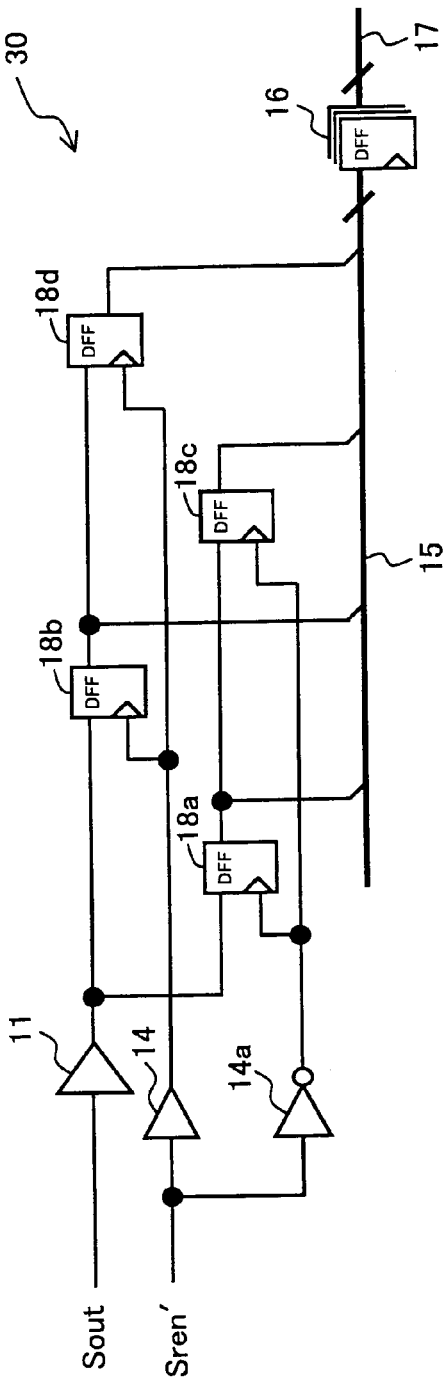
F I G. 9A
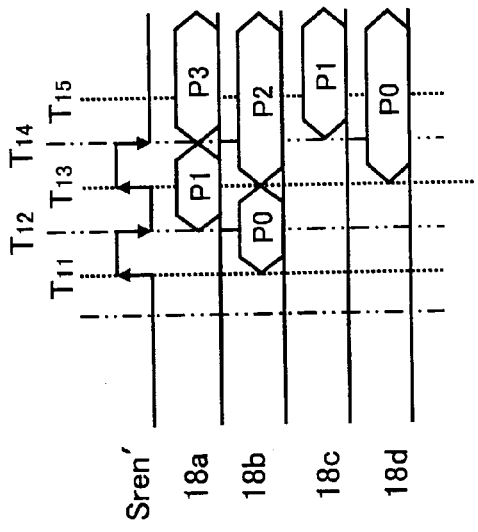
F I G. 9B

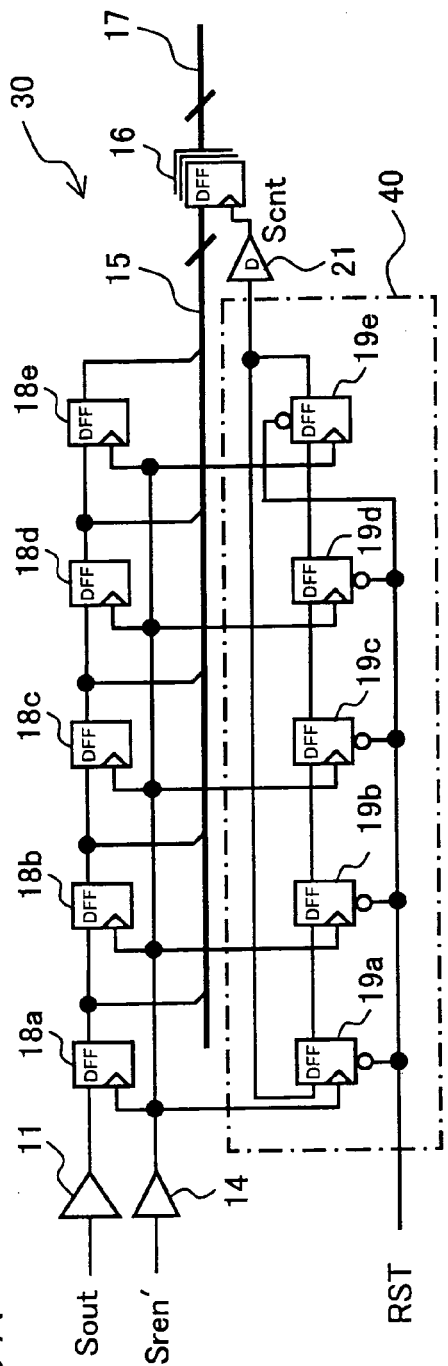
F I G. 10A
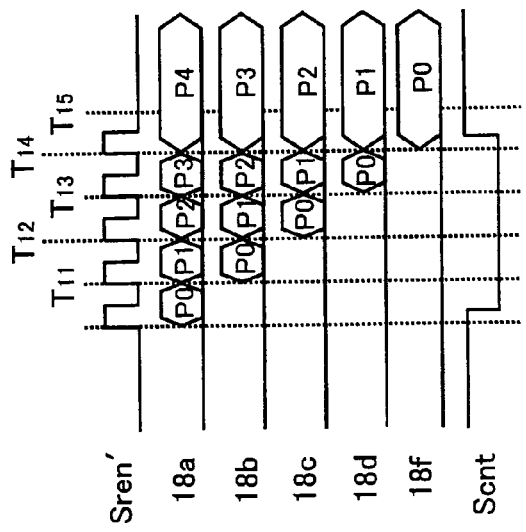
F I G. 10B

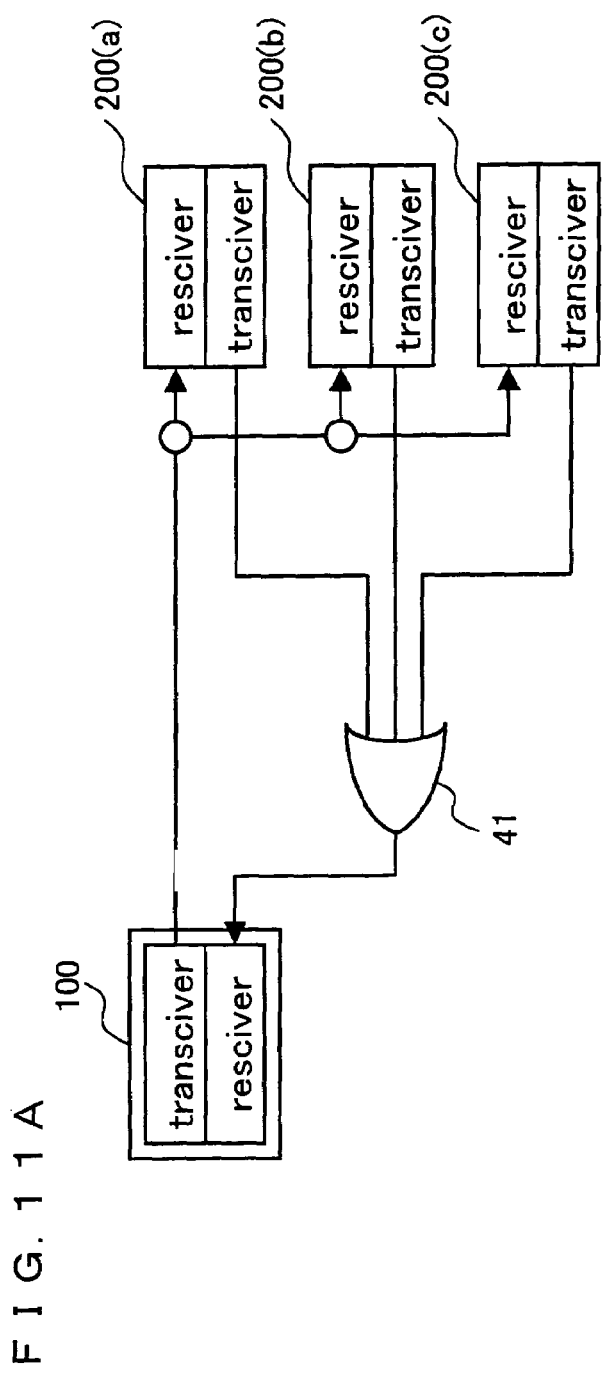
F I G. 1 1 A
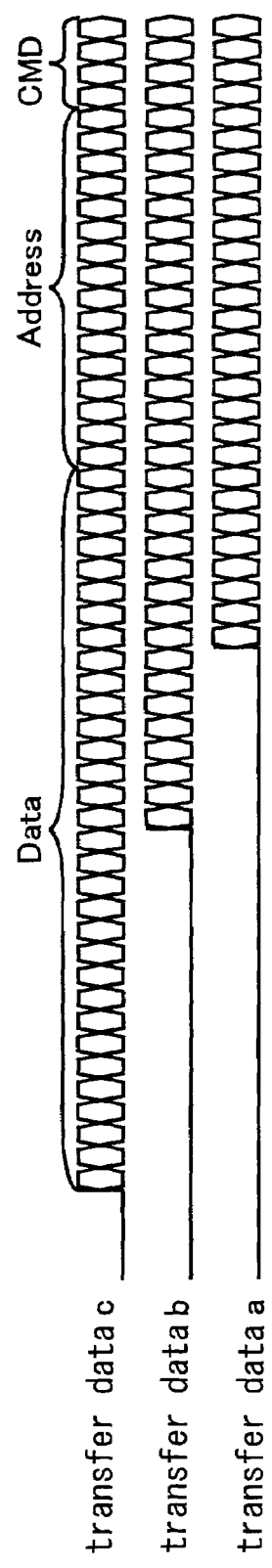
F I G. 1 1 B

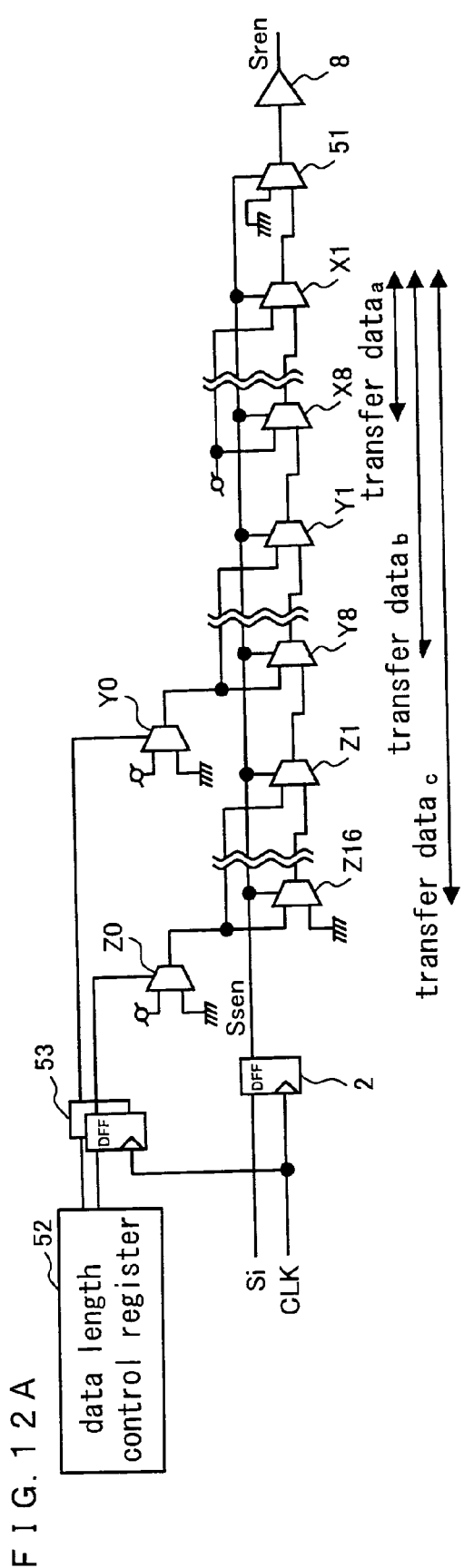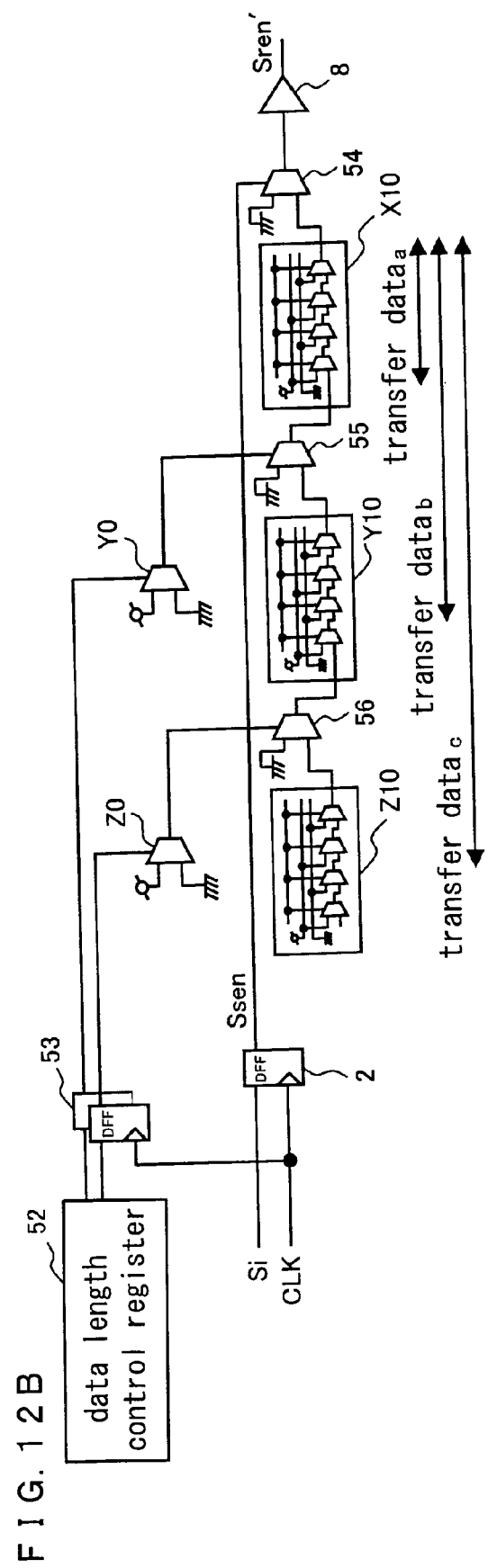
FIG. 12A
FIG. 12B

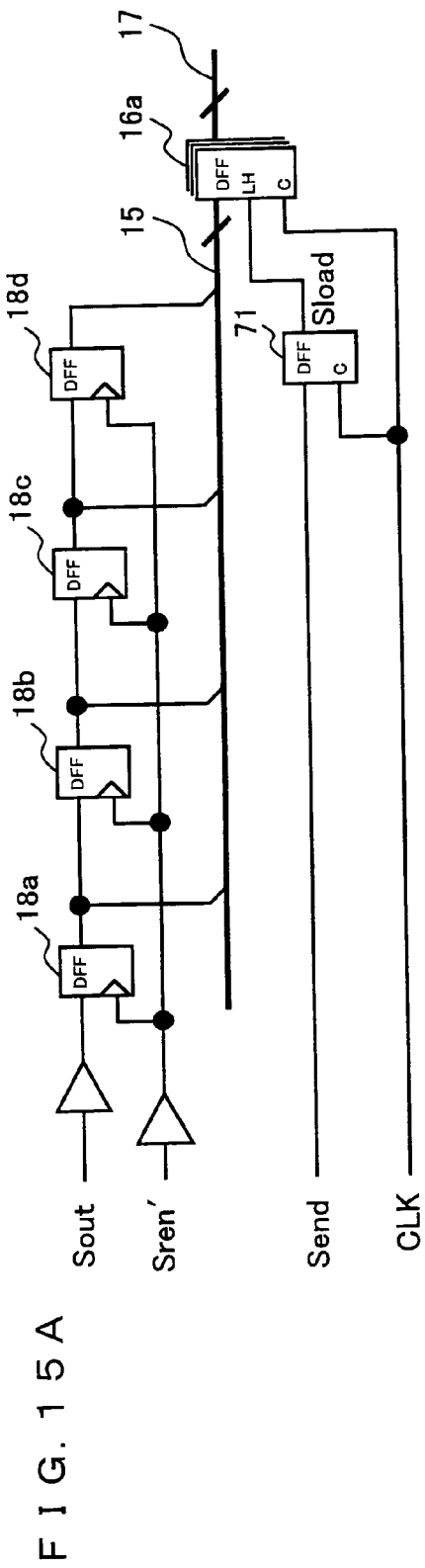
F I G. 1 5 A
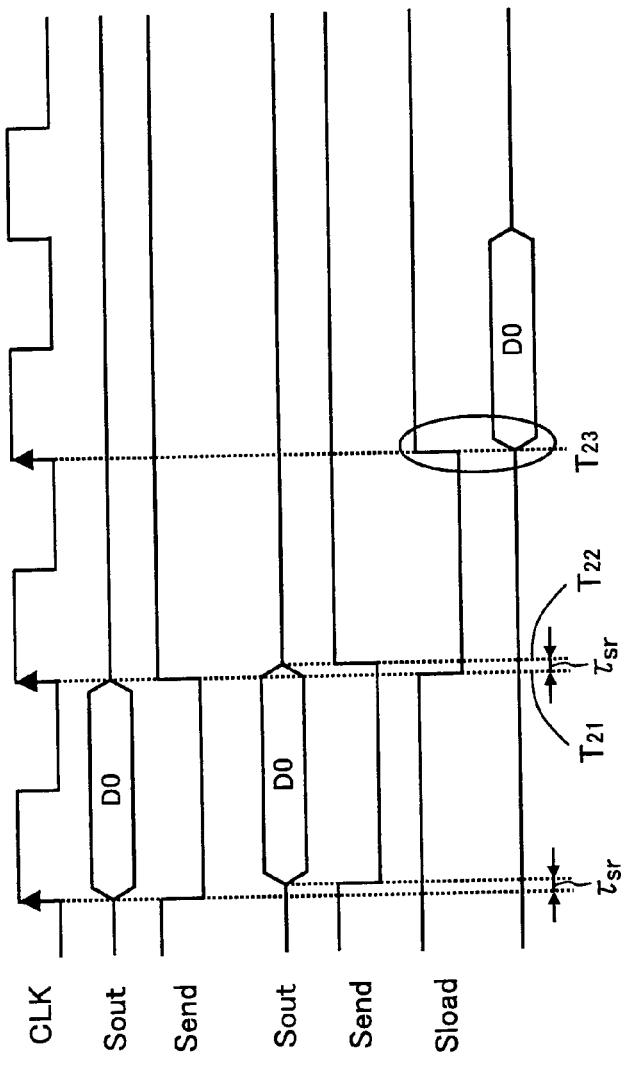
F I G. 1 5 B

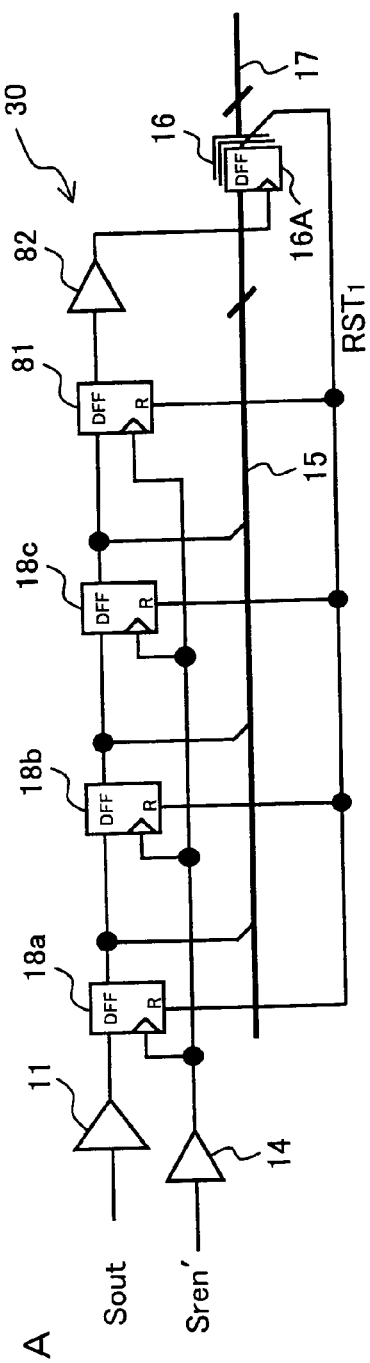
F I G. 16A
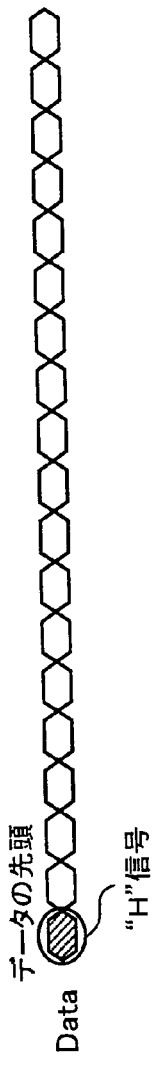
F I G. 16B
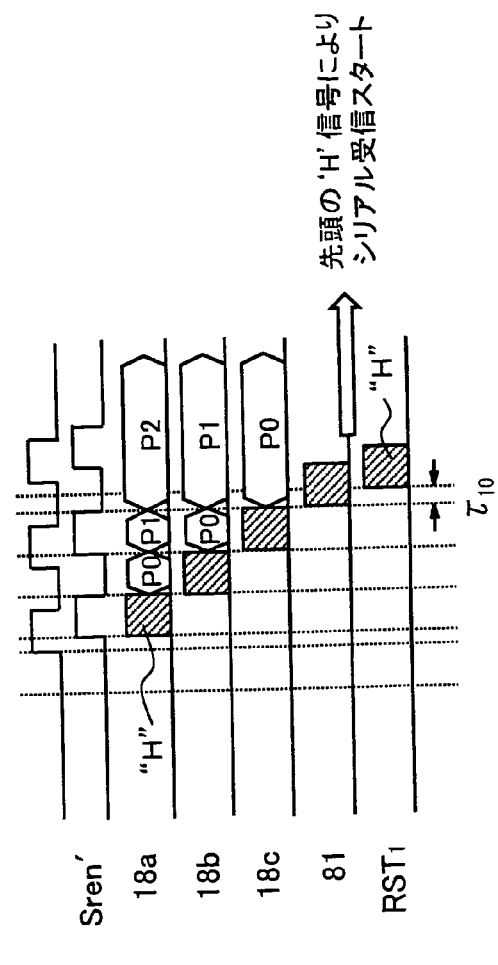
F I G. 16C

DATA TRANSFER APPARATUS FOR SERIAL DATA TRANSFER IN SYSTEM LSI

BACKGROUND OF THE INVENTION

1. Field of the Invention

The present invention relates to a data transfer apparatus for inter-circuit serial transfer of data inside a system LSI.

2. Description of the Related Art

In recent years, a system LSI has been increasing in size with more functions incorporated therein, along with which circuits and wirings used for inter-circuit data transfer inside the system LSI have also been increasing. The wirings, in particular, which actually serve to connect the internal components in the system LSI, take up a large percentage of a wiring resource in the system LSI, directly lead to the increase of the system LSI in size, that is, the increase of costs.

To deal with the situation, a method for serially connecting the circuits in the system LSI has been proposed. FIG. 17A shows a conventional data transfer apparatus according to the method, which comprises a transmission data bus 90, flip-flops 91a–91e, selectors 92a–92d, a buffer 93, a multiplier (PLL) 94 and the like, and operates as shown in FIG. 17B.

More specifically, a system clock CLK is multiplied by means of the multiplier 94 so that a high-speed transmission enable signal Ssen is generated and applied to clock inputs of the flip-flops 91a–91d.

When a data set signal DS is in an asserted state at a "L" level, the selectors 92a–92d select an "L" level input and outputs respective bits A3–A0 on the transmission data bus 90, whereas the buffer 93 outputs a consecutive signal at the "L" level because the flip-flop 91e in the final stage as a transfer gate is closed.

In response to the shift of the data set signal DS to an "H" level, the data transfer apparatus goes to a serial transfer mode. The flip-flops 91a–91d and the selectors 92a–92d are thereby serially connected. Further, a transfer clock Str with respect to the transfer gate 91e is raised from the "L" level to the "H" level. Thereby, whenever the transmission enable signal Ssen from the multiplier 94 rises, respective bit values are serially outputted from the transfer gate 91e and the buffer 93.

The serial transfer according to the conventional technology is realized by means of a clock signal. Therefore, the clock higher than a clock essentially required for the system is indispensable for the realization of a high-speed transfer. That is the reason why the multiplier 94 generating such a clock is necessarily provided.

SUMMARY OF THE INVENTION

A data transfer apparatus according to the present invention, which corresponds to a serial transmission circuit, comprises a plurality of selectors each having two inputs and one output and a transfer gate gating a data transfer. One of the two inputs in each of the plurality of selectors is connected to respective bits of a data bus in the order that transfer bits are arranged. The other inputs of the plurality of selectors are connected to outputs of the other selectors in the order that the transfer bits are arranged. The transfer gate is connected to an output of the final-stage selector of the plurality of selectors. Data of the corresponding bits of the data bus is set for each of the plurality of selectors when the transmission enable signal is in a negated state. Further, when the transmission enable signal is arranged to be in an asserted state, the plurality of selectors and the transfer gate are connected in the manner that the data can be serially transferred. In such a connecting state, the set data is serially transferred by means of a delayed action caused by an inter-selector delay time. As a possible configuration, a selector of the same type can be used for the transfer gate, and a buffer for amplification can be inserted among the selectors.

An example of the configuration further provides a second serial transmission circuit having the same configuration as the foregoing data transfer apparatus, wherein data (second data) of an identical logic consecutive during a transfer period representing the transfer period in place of the data on the data bus is set for a plurality of selectors included in the second serial transmission circuit when the transmission enable signal is in the negated state, and further, when the transmission enable signal is arranged to be in the asserted state, the plurality of selectors and the transfer gate of the second serial transmission circuit are connected in the manner that the second data can be serially transferred. In such a connecting state, the second data is serially transferred in the form of a reception enable signal by means of the delayed action caused by the inter-selector delay time.

BRIEF DESCRIPTION OF THE DRAWINGS

The present invention is illustrated by way of example and not limitation in the figures of the accompanying drawings, in which like references indicate similar elements and in which:

FIG. 2A is a circuit diagram illustrating a configuration of a serial transmission circuit in a data transfer apparatus according to an embodiment 2 of the present invention.

FIG. 2B is a timing chart illustrating an operation of the data transfer apparatus of FIG. 2A.

FIG. 4A is a circuit diagram illustrating a configuration of a serial transmission circuit in a data transfer apparatus according to an embodiment 4 of the present invention.

FIG. 4B is a timing chart illustrating an operation of the data transfer apparatus of FIG. 4A.

FIG. 5A is a circuit diagram illustrating a configuration of a serial transmission circuit in a data transfer apparatus according to an embodiment 5 of the present invention.

FIG. 5B is a timing chart illustrating an operation of the data transfer apparatus of FIG. 5A.

FIG. 6A is a circuit diagram illustrating a configuration of a serial transmission circuit in a data transfer apparatus according to an embodiment 6 of the present invention.

FIG. 6B is a timing chart illustrating an operation of the data transfer apparatus of FIG. 6A.

FIG. 8A is a circuit diagram illustrating a configuration of a serial reception circuit in a data transfer apparatus according to an embodiment 8 of the present invention.

FIG. 8B is a timing chart illustrating an operation of the data transfer apparatus of FIG. 8A.

FIG. 9A is a circuit diagram illustrating a configuration of a serial reception circuit in a data transfer apparatus according to an embodiment 9 of the present invention.

FIG. 9B is a timing chart illustrating an operation of the data transfer apparatus of FIG. 9A.

FIG. 10A is a circuit diagram illustrating a configuration of a serial reception circuit in a data transfer apparatus according to an embodiment 10 of the present invention.

FIG. 10B is a timing chart illustrating an operation of the data transfer apparatus of FIG. 10A.

FIG. 11A is a circuit diagram illustrating configurations of a bus master circuit and a plurality of bus slave circuits in a data transfer apparatus according to an embodiment 11 of the present invention.

FIG. 11B is a structural illustration of data in plural forms in the transfer apparatus according to the embodiment 11.

FIG. 12A is a circuit diagram illustrating a configuration of a serial transmission circuit in the data transfer apparatus according to the embodiment 11.

FIG. 12B is a circuit diagram illustrating a configuration of a serial transmission circuit in a data transfer apparatus according to a modification example of the embodiment 11.

FIG. 15A is a circuit diagram illustrating a configuration of a serial reception circuit in the data transfer apparatus according to the embodiment 13.

FIG. 15B is a timing chart illustrating an operation of the data transfer apparatus of FIG. 15A.

FIG. 16A is a circuit diagram illustrating a configuration of a serial transmission circuit in a data transfer apparatus according to an embodiment 14 of the present invention.

FIG. 16B is a structural illustration of data in the data transfer apparatus of FIG. 16A.

FIG. 16C is a timing chart illustrating an operation of the data transfer apparatus of FIG. 16A.

DESCRIPTION OF THE PREFERRED EMBODIMENTS

Figure 1A:
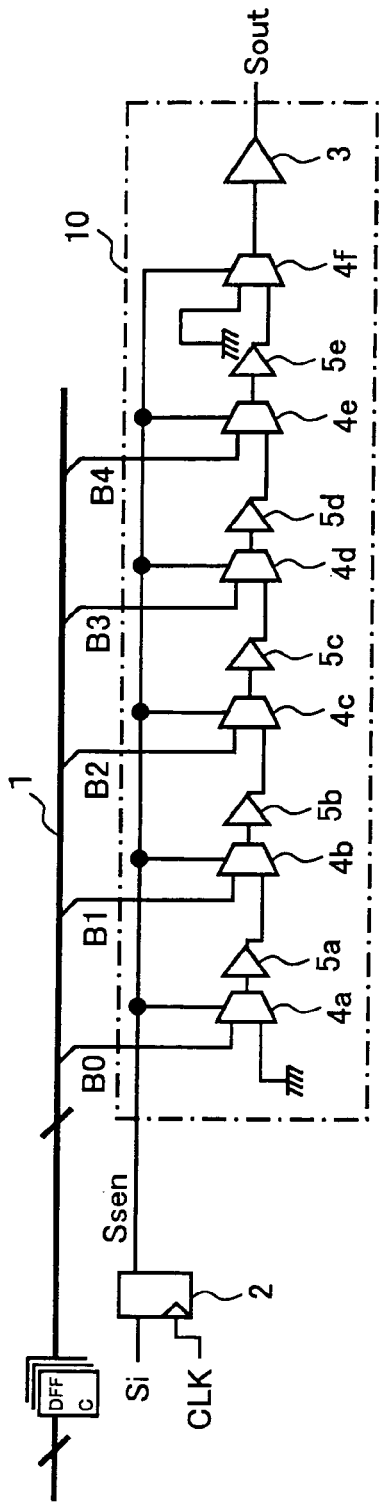
FIG. 1A is a circuit diagram illustrating a configuration of a serial transmission circuit in a data transfer apparatus according to an embodiment 1 of the present invention.

Hereinafter, a data transfer apparatus according to preferred embodiments of the present invention is described in detail referring to the drawings. Embodiments 1 through 6 refer to a serial transmission circuit of the data transfer apparatus.

Embodiment 1

FIG. 1A is a circuit diagram illustrating a configuration of a serial transmission circuit in a data transfer apparatus according to an embodiment 1 of the present invention. In FIG. 1A, a reference numeral 10 denotes a serial transmission circuit, a reference numeral 1 denotes a data bus for transmission having a plurality of bit lines. A reference numeral 2 denotes a flip-flop. A reference numeral 3 denotes a buffer for output. Reference symbols 4a–4e denote selectors. A reference symbol 4f denotes a selector as a transfer gate. Reference symbols 5a–5e denote buffers for amplification. A reference symbol CLK denotes a system clock, which is a basic clock in a system LSI. A reference symbol Si denotes a transfer-start instruction signal. A reference symbol Ssen denotes a transmission enable signal. A reference symbol Sout denotes a serial transfer data.

The plurality of selectors 41–4f and the plurality of buffers 5a–5e are serially connected in the manner that they are alternately disposed. Respective bits B0–B4 of the transmission data bus 1 are connected to "H" level inputs of the selectors 4a–4e. Respective outputs of the selectors 4a–4e are connected to "L" level inputs of the selectors 4b–4f in the respective rear stages via the buffers 5a–5e. The respective bits of the transmission bus 1 are connected to the selectors 4a–4e in the order that the transfer bits are arranged.

An "L" level input of the first-stage selector 4a is connected to a ground-side "L" level. An "H" level input of the selector 4f as the transfer gate is connected to the ground-side "L" level.

An output of the selector 4f is connected to the buffer 3. Outputs of the buffers 5a–5e are respectively connected to the "L" level inputs of the selectors 4b–4f in the respective rear stages.

The total number of the selectors 4a–4e, except for the selector 4f serving as the transfer gate, is identical to the total number of the bits B0–B4 of the transmission data bus 1. The selectors 4a–4f are serially connected with the buffers 5a–5e interposed therebetween.

The flip-flop 2 generates and outputs the transmission enable signal Ssen in synchronization with the system clock CLK in response to the input of the transfer-start instruction signal Si. The transmission enable signal Ssen is provided for respective selective control inputs of the selectors 4a–4f. The transfer-start instruction signal Si and the transmission enable signal Ssen are active low.

The selectors 4a–4f select and output signals of the upper-side "H" level inputs when the transmission enable signal Ssen is of a logic "H", and select and output signals of the lower-side "L" level inputs when the transmission enable signal Ssen is of a logic "L". More specifically, when the transmission signal Ssen is at the "H" level, the selectors 4a–4e select the transmission data bus 1 side, while the selector 4f selects the ground-side "L" level. When the transmission enable signal Ssen is at the "L" level, the selector 4a selects the ground-side "L" level, while the selectors 4b–4f select the outputs of the buffers 5a–5e in the respective preceding stages.

Figure 1B:
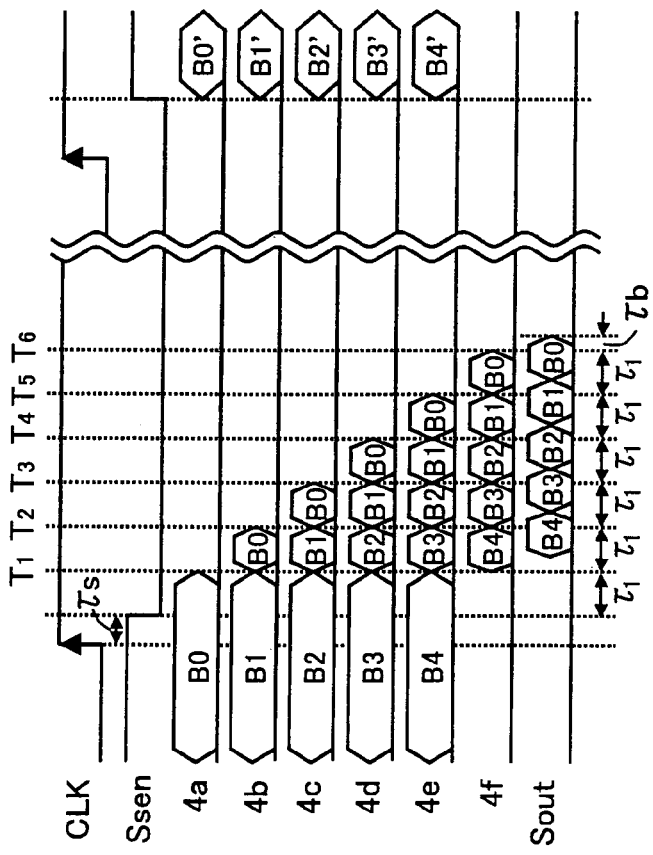
FIG. 1B is a timing chart illustrating an operation of the data transfer apparatus of FIG. 1A.

Next, the operation of the foregoing data transfer apparatus is described based on FIG. 1B.

When the transmission enable signal Ssen is at the "H" level (high voltage level) and in a negated state (signal is invalid), the selectors 4a–4e select the respective bits B0–B4 of the transmission data bus 1, while the selector 4f as the transfer gate selects the ground-side "L" level (low voltage level). The outputs of the selectors 4a–4e are transmitted to the selectors 4b–4f in the respective rear stages via the buffers 5a–5e. In the foregoing state, the selector 4f as the transfer gate selects the ground-side "L" level during the period when the transmission enable signal Ssen is in the negated state at the "H" level. Therefore, the serial transfer data Sout outputted from the buffer 3 results in consecutive data at the "L" level irrespective of values of the bits B0–B4.

Next, when the transfer-start instruction signal Si, which is active low, is inputted to the flip-flop 2, and the system clock CLK rises, the transmission enable signal Ssen shifts to the "L" level state, resulting in an asserted state (signal is valid) after the passage of a setup time τ s of the flip-flop 2. The serial transmission circuit 10 thereby shifts to a serial transfer mode.

As a result, the arrangement that the selectors 4a–4e are connected to the transmission data bus 1 side is changed over to the arrangement that the selectors 4a–4f are serially connected. For an instant immediately after the changeover, the outputs of the selectors 4a–4e and the outputs of the buffers 5a–5e still retain the values of the bits B0–B4, which are connected respectively thereto.

The operation of the serial transfer mode is described below. Between the respective selectors exist delays including a delay of one buffer. A delay time thereof is referred to as an inter-selector delay time $\tau_1$. At a timing $T_1$ subsequent to the passage of the inter-selector delay time $\tau_1$ passes after the transmission enable signal Ssen is asserted, the value of the bit B0 in the outputs of the first-stage selector 4a and buffer 5a is transferred to the outputs of the rear-stage selector 4b and buffer 5b. Accordingly, the value of the bit B1 in the outputs of the selector 4b and buffer 5b is transferred to the outputs of the rear-stage selector 4c and buffer 5c, the value of the bit B2 in the outputs of the selector 4c and buffer 5c is transferred to the outputs of the rear-stage selector 4d and buffer 5d, the value of the bit B3 in the outputs of the selector 4d and buffer 5d is transferred to the outputs of the rear-stage selector 4e and buffer 5e, and the value of the bit B4 in the outputs of the selector 4e and buffer 5e is transferred to the selector 4f. Further, the value of the bit B4 is outputted as a first bit of the serial transfer data Sout via the buffer 3.

In the case of the serial transfer, in the selector 4f as the transfer gate, where the ground-side "L" level is selected immediately prior thereto, the value of the bit B4 in the outputs of the selector 4e and buffer 5e is transferred and outputted as the first bit of the serial transfer data Sout, though the output thereof is delayed by a delay time τb of the buffer 3 (same applies in the following description). During that time, the first-stage selector 4a selects the ground-side "L" level and the output thereof is at the "L" level.

At a timing $T_2$ after the inter-selector delay time $\tau_1$ further passes subsequent to the timing $T_1$, the value of the bit B0 in the output of the selector 4b is transferred to the output of the rear-stage selector 4c, the value of the bit B1 in the output of the selector 4c is transferred to the output of the rear-stage selector 4d, the value of the bit B2 in the output of the selector 4d is transferred to the output of the rear-stage selector 4e, and the value of the bit B3 in the output of the selector 4e is transferred to the output of the selector 4f. Further, the value of the bit B3 is outputted via the buffer 3, and transfer data of the serial transfer data Sout thereby changes from the bit B4 to bit B3. During that time, the first-stage selector 4a still selects the ground-side "L" level, and the outputs of the selectors 4a and 4b result in the "L" level.

At a timing T3 after the inter-selector delay time $\tau_1$ further passes subsequent to the timing $T_2$, the value of the bit B0 is transferred to the output of the selector 4d, the value of the bit B1 is transferred to the output of the selector 4e, and the value of the bit B2 is transferred to the output of the selector 4f. Further, the value of the bit B2 is outputted via the buffer 3, and the transfer data of the serial transfer data Sout thereby changes from the bit B3 to bit B2. During that time, the first-stage selector 4a still selects the ground-side "L" level, and the outputs of the selectors 4a through 4c result in the "L" level.

At a timing $T_4$ after the inter-selector delay time $\tau_1$ further passes subsequent to the timing T3, the value of the bit B0 is transferred to the output of the selector 4e, the value of the bit B1 is transferred to the output of the selector 4f, and the transfer data of the serial transfer data Sout thereby changes from the bit B2 to bit B1. During that time, the first-stage selector 4a still selects the ground-side "L" level, and the outputs of the selectors 4a through 4d result in the "L" level.

At a timing $T_5$ after the inter-selector delay time $\tau_1$ further passes subsequent to the timing $T_4$, the value of the bit B0 is transferred to the output of the selector 4f, and the transfer data of the serial transfer data Sout thereby changes from the bit B1 to bit B0. During that time, the first-stage selector 4a still selects the ground-side "L" level, and the outputs of the selectors 4a through 4e result in the "L" level.

From the timings $T_1$ though $T_5$, the serial transfer data Sout undergoes the transition in the order of B4, B3, B2, B1 and B0.

With a further lapse of time, the output of the selector 4f goes to the "L" level, which results in the output of the consecutive data at the "L" level until the next transfer-start instruction signal Si is inputted. More specifically, when the bit B0 initially present in the selector 4a is successfully transferred as the final data of the serial transfer data Sout, the consecutive data at the "L" level is then outputted as a final step, thereby completing the serial transfer.

As described, the serial data transfer in conjunction with the serial connection of the selectors 4a–4f is realized based on the delayed action caused by the inter-selector delay time $\tau_1$. It is the serial transfer, not by means of a transfer clock, but through utilizing the delayed action included in the serial transmission circuit itself.

Thereafter, when the transfer-start instruction signal Si changes to the "H" level again, the selectors 4a–4e select the transmission-data-bus-1 side, and correspondingly fetch values of new bits B0'–B4' set on the transmission data bus 1.

In the foregoing process, the inter-selector delay time $\tau_1$ is quite short relative to a cycle of the system clock CLK, and the substantially high-speed serial transfer is thereby realized.

In the foregoing process, the selector 4f as the transfer gate selects the "L" level when the transmission enable signal Ssen is in the negated state at the "H" level, and the first-stage selector 4a correspondingly selects the "L" level when the transmission enable signal Ssen is in the asserted state at the "L" level, so that the serial transfer data Sout during the period when the data transfer is not executed can be the consecutive data at the "L" level. To put it simply, the data string is settled to prevent any erroneous data from being transferred in the non-transfer period. The settled data string can be the consecutive data at the "H" level, in which case the selector 4f as the transfer gate selects the "H" level when the transmission enable signal Ssen is in the negated state, while the first-stage selector 4a selects the "H" level when the transmission enable signal Ssen is in the asserted state. The transfer-start instruction signal Si and transmission enable signal Ssen can be active high instead of active row.

As described, according to the embodiment 1, the serial data transfer is not synchronized with the clock, but executed in the manner that the data is transferred per delay time by means of the inter-selector delay time, thereby making it unnecessary to provide a multiplier (PLL) generating a high-speed clock essentially required for the serial transfer. Further, the disuse of the clock in the data transfer leads to a reduction of a gate scale. Therefore, an inexpensive LSI can be materialized because the reduction of the gate scale achieves semiconductor elements reduced in size, and a wiring resource for the semiconductor elements is thereby reduced.

Embodiment 2

Referring to FIGS. 2A and 2B, a data transfer apparatus according to an embodiment 2 of the present invention is described. The data transfer apparatus according to the embodiment 2 comprises latches serving as data retaining circuits. In FIG. 2A, a reference numeral 10 denotes a serial transmission circuit, a reference numeral 1 denotes a data bus for transmission having a plurality of bit lines, a reference numeral 3 denotes a buffer, reference symbols 4a–4d denote selectors, a reference symbol 4e denotes a selector as a transfer gate, reference symbols 6a–6e denote the latches as the data retaining circuits, a reference symbol DS denotes a data set signal, and a reference symbol Ssen' denotes a transmission enable signal.

The plurality of selectors 4a–4e and the plurality of latches 6a–6e are serially connected in the manner that they are alternately disposed. Respective bits C0–C3 of the transmission data bus 1 are connected to "H" level inputs of the selectors 4a–4d. Respective outputs of the selectors 4a–4d are connected to "L" level inputs of the selectors 4b–4e in the respective rear stages via the latches 6a–6d. The respective bits of the transmission data bus 1 are connected to the selectors 4a–4d in the order that the transfer bits are arranged. An "L" level input of the first-stage selector 4a and an "H" level input of the selector 4e as the transfer gate are connected to the ground-side "L" level. An output of the selector 4e is connected to the buffer 3 via the latch 6e. Respective outputs of the latches 6a–6d are connected to the "L" level inputs of the selectors 4b–4e in the respective rear stages. An output of the final-stage latch 6e is connected to the buffer 3.

The total number of the selectors 4a–4d, except for the selector 4e serving as the transfer gate, is identical to the total number of the bits C0–C3 of the transmission data bus 1. The selectors 4a–4e are serially connected with the latches 6a–6d interposed therebetween. The transmission enable signal Ssen', which is active low, is provided for respective gate inputs of the latches 6a–6e.

The selectors 4a–4e, when the data set signal DS is in the asserted state at the "H" level, select and output signals of the upper-side "H" level inputs, and select and output signals of the lower-side "L" level inputs when the data set signal DS is in the negated state at the "L" level. More specifically, when the data set signal DS is in the asserted state, the selectors 4a–4d select the transmission data bus 1 side, while the selector 4e as the transfer gate selects the ground-side "L" level. When the data set signal DS is in the negated state, the selector 4a in the first stage selects the ground-side "L" level, while the selectors 4b–4e select the outputs of the latches 6a–6d in the respective preceding stages.

Referring to FIG. 2B, the operation of the serial transmission circuit of the foregoing data transfer apparatus is described.

When the data set signal DS is in the asserted state at the "H" level, the selectors 4a–4d select the respective bits C0–C3 of the transmission data bus 1. The outputs of the selectors 4a–4d correspond to the respective bits C0–C3 of the transmission data bus 1. The respective bits C0–C3 are retained in the latches 6a–6d. The selector 4e as the transfer gate selects the ground-side "L" level when the data set signal DS is in the asserted state at the "H" level. Therefore, the serial transfer data Sout outputted from the buffer 3 results in the consecutive data at the "L" level irrespective of values of the bits C0–C3.

Next, the data set signal DS is shifted to the negated state at the "L" level. Then, in the transition of the transmission enable signal Ssen' to the asserted state at the "L" level, the serial transmission circuit 10 shifts to the serial transfer mode. As a result, the arrangement that the selectors 4a–4d are connected to the transmission data bus 1 side is changed over to the arrangement that the selectors 4a–4e and the latches 6a–6e are serially connected. For an instant immediately after the changeover, the respective latches 6a–6d retain the values of the bits C0–C3.

The operation of the serial transfer mode is described below.

Between the selectors exist delays including a delay of one selector and a delay of one latch. A delay time thereof is referred to as an inter-selector delay time $\tau_2$.

At a timing $T_1$ after the inter-selector delay time $\tau_2$ passes subsequent to the transmission enable signal Ssen' is asserted, the value of the bit C0 retained in the first-stage latch 6a is transferred to the latch 6b in the rear stage via the selector 4b in the rear stage. The value of the bit C1 retained in the latch 6b is transferred to the latch 6c in the rear stage via the selector 4c in the rear stage. The value of the bit C2 retained in the latch 6c is transferred to the latch 6d in the rear stage via the selector 4d in the rear stage. The value of the bit C3 retained in the latch 6d is transferred to the latch 6e in the rear stage via the selector 4e in the rear stage. Further, the value "L" retained in the latch 6e is outputted as the first bit of the serial transfer data Sout via the buffer 3, though the output thereof is delayed by the delay time of the buffer 3 (same applies in the following description). During that time, the first-stage selector 4a selects the ground-side "L" level and the output thereof is at the "L" level.

At a timing $T_2$ after the inter-selector delay time $\tau_2$ further passes subsequent to the timing $T_1$, the value of the bit C0 in the output of the latch 6b is transferred to the latch 6c in the rear stage. The value of the bit C1 in the output of the latch 6c is transferred to the latch 6d in the rear stage. The value of the bit C2 in the output of the latch 6d is transferred to the latch 6e in the final stage. Further, the value of the bit C2 is outputted via the buffer 3. The transfer data of the serial transfer data Sout changes from the bit C3 to the bit C2. During that time, the first-stage selector 4a still selects the "L" level, and the outputs of the selectors 4a and 4b are at the "L" level.

At a timing T3 after the inter-selector delay time $\tau_2$ further passes subsequent to the timing $T_2$, the value of the bit C0 is transferred to the latch 6d. The value of the bit C1 in the output of the latch 6d is transferred to the latch 6e in the final stage. Further, the value of the bit C1 is outputted via the buffer 3. The transfer data of the serial transfer data Sout changes from the bit C2 to the bit C1. During that time, the first-stage selector 4a still selects the "L" level, and the outputs of the latches 6a–6c are at the "L" level.

At a timing $T_4$ after the inter-selector delay time $\tau_2$ further passes subsequent to the timing T3, the value of the bit C0 is transferred to the latch 6e in the final stage. Further, the value of the bit C0 is outputted via the buffer 3. The transfer data of the serial transfer data Sout changes from the bit C1 to the bit C0. During that time, the first-stage selector 4a still selects the "L" level, and the outputs of the latches 6a–6d are at the "L" level.

With a further lapse of time, the output of the final-stage latch 6e goes to the "L" level, and continues to be the consecutive data at the "L" level until the next data set signal DS rises. More specifically, when the bit C0 initially present in the latch 6a is successfully transferred as the final data of the serial transfer data Sout, the consecutive data at the "L" level is then outputted as a final step, thereby completing the serial transfer.

In the foregoing manner, the serial transfer of the data in conjunction with the serial connection of the selectors 4a–4e is realized based on the delayed action caused by the inter-selector delay time $\tau_2$. In the serial transmission circuit according to the embodiment 2, the serial transfer is realized, not by means of the transfer clock, but utilizing the delayed action included in the serial transmission circuit itself.

Thereafter, when the data set signal DS changes again to the "H" level, the latches 6a–6d select the transmission data bus 1 side. In accordance with the selection, the latches 6a–6d fetch values of new bits C0'–C3', which are set on the transmission data bus 1, In the foregoing process, the delay time $\tau_2$ is quite short relative to the cycle of the system clock CLK, thereby achieving the substantially high-speed serial transfer.

In the foregoing process, when the data set signal DS is in the asserted state at the "H" level, the selector 4e as the transfer gate selects the "L" level. To comply with the selection, the first-stage selector 4a selects the "L" level when the data set signal DS is at the "L" level. The purposes of the selection are that the serial transfer data Sout during the period when the data is not transferred is settled to be the consecutive data at the "L" level, and erroneous data is not transferred during the non-transfer period.

The settled data string can be the consecutive data at the "H" level, in which case the selector 4e as the transfer gate selects the "H" level when the data set signal DS is in the asserted state. To comply with the selection, the first-stage selector 4a selects the "H" level when the transmission enable signal Ssen' is in the asserted state. Further, the data set signal DS and transmission enable signal Ssen' can be active high instead of active low.

According to the data transfer apparatus described above, the serial data transfer is not synchronized with the clock, but executed in the manner that the data is transferred per delay time by means of the inter-selector delay time, thereby making it unnecessary to provide the multiplier (PLL) generating the high-speed clock essentially required for the serial transfer. Further, the disuse of the clock in the data transfer apparatus leads to a reduced gate scale. Therefore, an inexpensive LSI can be materialized because the reduction of the gate scale achieves semiconductor elements reduced in size, and a wiring resource for the semiconductor elements is thereby reduced.

Embodiment 3

Figure 3A:
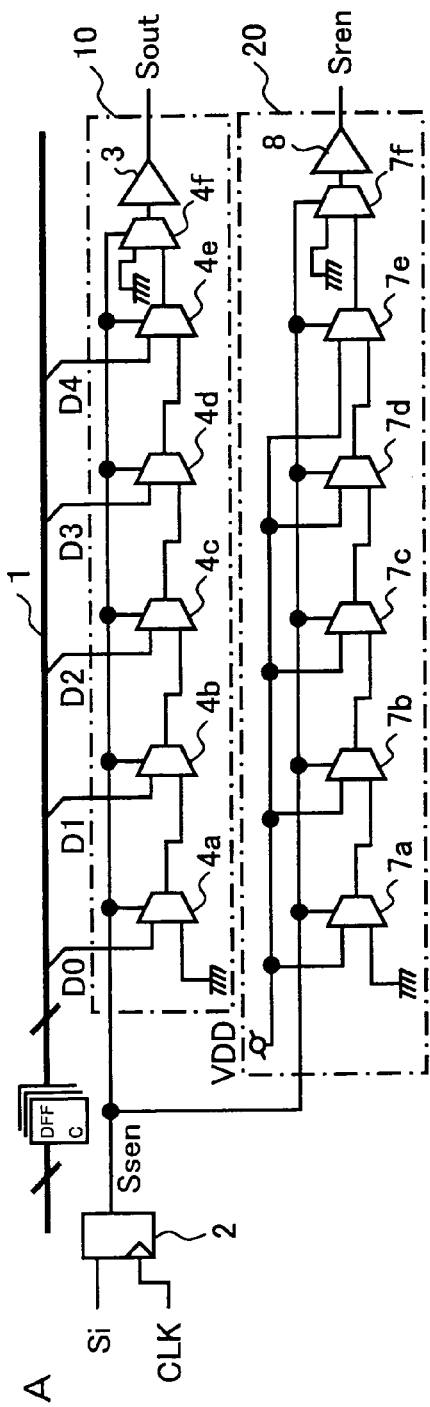
FIG. 3A is a circuit diagram illustrating a configuration of a serial transmission circuit in a data transfer apparatus according to an embodiment 3 of the present invention.
Figure 3B:
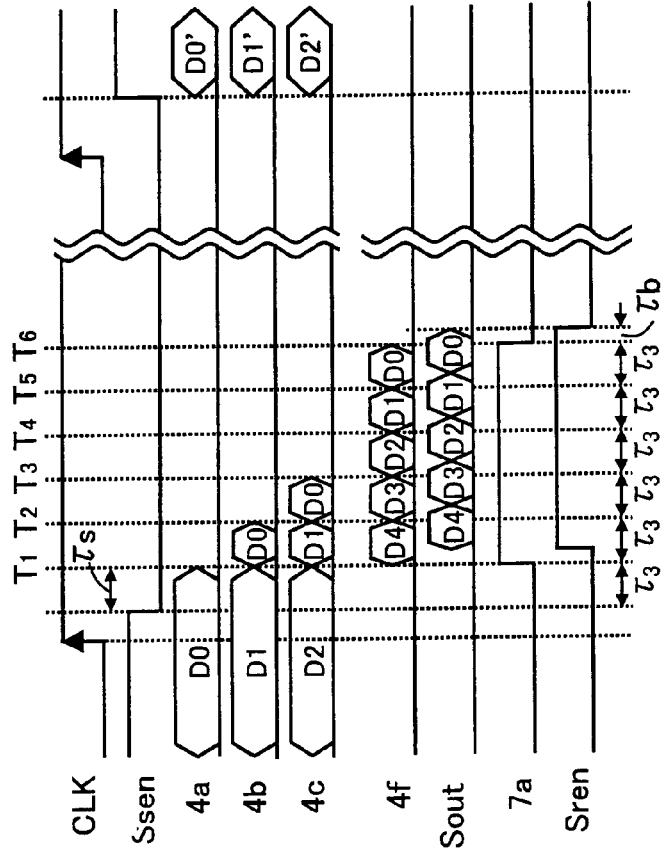
FIG. 3B is a timing chart illustrating an operation of the data transfer apparatus of FIG. 3A.

Referring to FIGS. 3A and 3B, a data transfer apparatus according to an embodiment 3 of the present invention is described. The present data transfer apparatus has a function of transmitting a reception enable signal together with the serial transfer data to a reception side and a function of generating the reception enable signal required for the reception side to execute the serial data transfer.

In FIG. 3A, a reference numeral 10 denotes a serial transmission circuit, 20 denotes a second serial transmission circuit, 1 denotes a data bus having a plurality of bit lines, 2 denotes a flip-flop, 3 denotes a buffer, reference symbols 4a–4e denote selectors, 4f denotes a selector serving as a transfer gate, 7a–7e denote selectors constituting the second serial transmission circuit 20, 7f denotes a selector as a transfer gate, 8 denotes a buffer, CLK denotes a system clock as a basic clock in the system LSI, Si denotes a transfer-start instruction signal, and Ssen denotes a transmission enable signal. The plurality of selectors 4a–4f of the serial transmission circuit 10 is serially connected. The plurality of selectors 7a–7f of the second serial transmission circuit 20 is also serially connected.

The plurality of selectors 4a–4f of the serial transmission circuit 10 is described below.

The serial transmission circuit 10 has basically the same configuration as the serial transmission circuit according to the embodiment 1 except for the omission of the buffers 5a–5e. Respective bits D0–D4 of the transmission data bus 1 are connected to "H" level inputs of the selectors 4a–4e. Respective outputs of the selectors 4a–4e are connected to "L" level inputs of the selectors 4b–4f in the respective rear stages. The respective bits D0–D4 of the transmission data bus 1 are connected to the selectors 4a–4e in the order that the transfer bits are arranged. An "L" level input of the selector 4a in the first stage and an "H" level input of the selector 4f as the transfer gate are connected to the ground-side "L" level, and an output of the selector 4f is connected to the buffer 3.

The total number of the selectors 4a–4e, except for the selector 4f as the transfer gate, is identical to the total number of the bits D0–D4 of the transmission data bus 1. The active low transmission enable signal Ssen, which is outputted from the flip-flop 2, is supplied to selective control inputs of the selectors 4a–4f.

The selectors 4a–4f select and output signals of the upper-side "H" level inputs when the transmission enable signal Ssen is at the "H" level, and select and output signals of the lower-side "L" level inputs when the transmission enable signal Ssen is at the "L" level. In other words, the selectors 4a–4e select the transmission data bus 1 side when the transmission enable signal Ssen is at the "H" level, and the selector 4f selects the ground-side "L" level. When the transmission enable signal Ssen is at the "L" level, the selector 4a selects the ground-side "L" level, and the selectors 4b–4f select the outputs of the selectors 4a–4e in the respective preceding stages.

Next, the plurality of selectors 7a–7f of the second serial transmission circuit 20 is described.

A power-supply-potential "H" level is connected to "H" level inputs of the selectors 7a–7e. Respective outputs of the selectors 7a–7e are connected to "L" level inputs of the selectors 7b–7f in the respective rear stages. An "L" input of the first-stage selector 7a and an "H" input of the selector 7f as the transfer gate are connected to the ground-side "L" level. An output of the selector 7f is connected to the buffer 8. The total number of the selectors 7a–7f is identical to the total number of the selectors 4a–4f of the serial transmission circuit 10. The transmission enable signal Ssen from the flip-flop 2 is supplied to the respective selectors 7a–7f.

The selector 7a–7f select and output signals of the upper-side "H" level inputs when the transmission enable signal Ssen is at "H" level. The selectors 7a–7f select and output signals of the lower-side "L" level inputs when the transmission enable signal Ssen is at the "L" level. In other words, when the transmission enable signal Ssen is at the "H" level, the selectors 7a–7e select the power-supply-potential "H" level, and the selector 7f as the transfer gate selects the ground-side "L" level. When the transmission enable signal Ssen is at the "L" level, the selector 7a selects the ground-side "L" level, and the selectors 7b–7f select the outputs of the selectors 7a–7e in the respective preceding stages.

Referring to FIG. 5B, the operations of the serial transmission circuits of the foregoing data transfer apparatus are described.

The basic operation of the serial transmission circuit 10 is the same as in the description of the embodiment 1. When the transmission enable signal Ssen is in the negated state at the "H" level, the serial transfer data Sout outputted from the buffer 3 is the consecutive data at the "L" level irrespective of the values of the bits D0–D4. In the serial transmission circuit 20, any of the selectors 7a–7f selects the power-supply-potential "H" level when the transmission enable signal Ssen is in the negated state at the "H" level.

When the transmission enable signal Ssen shifts to the asserted state at the "L" level, the serial transmission circuit 10 shifts to the serial transfer mode. The operation of the serial transmission circuit 10 is basically the same as in the embodiment 1. In the passage of time, the buffer 3 serially outputs the serial transfer data Sout, in the order of D4, D3, D2, D1 and D0. The serial transfer is executed based on a delayed action caused by an inter-selector delay time $\tau_3$. In FIG. 3B, the output states of the selectors 4d and 4e are omitted.

The operation of the second serial transmission circuit 20 in the serial transfer mode is now described. In FIG. 3B, of the selectors 7a–7f, the output of the first-stage selector 7a and a reception enable signal Sren alone are shown.

Immediately prior to the assertion of the transmission enable signal Ssen, the selectors 7a–7e select the power-supply-potential "H" level, therefore all of the outputs of the selectors 7a–7e are at the "H" level. However, because the selector 7f as the transfer gate selects the ground-side "L" level, the reception enable signal Sren is the consecutive data at the "L" level.

At a timing $T_1$ after the inter-selector delay time $\tau_3$ passes subsequent to the assertion of the transmission enable signal Ssen, the "H" level in the output of the first-stage selector 7a is transferred to the output of the selector 7b in the rear stage, the "H" level in the output of the selector 7b is transferred to the output of the selector 7c in the rear stage, the "H" level in the output of the selector 7c is transferred to the output of the selector 7d in the rear stage, the "H" level in the output of the selector 7d is transferred to the output of the selector 7e in the rear stage, and the "H" level in the output of the selector 7e is transferred to the output of the selector 7f. Further, the "H" level is outputted in the form of the reception enable signal Sren via the buffer 8. In the serial transfer, the selector 7f as the transfer gate, which selects the ground-side "L" level immediately prior thereto, outputs the "H" level in the form of the reception enable signal Sren in response to the transfer of the "H" level in the output of the selector 7e to the selector 7f. During that time, the fist-stage selector 7a selects the ground-side "L" level, and the output there is at the "L" level.

At a timing $T_2$ after the inter-selector delay time $\tau_3$ further passes subsequent to the timing $T_1$, the "L" level in the output of the selector 7a is transferred to the output of the selector 7b in the rear stage, the "H" level in the outputs of the selectors 7b–7e is transferred to the respective outputs of the selectors 7c–7f in the respective rear stages, and the reception enable signal Sren continuously outputs the "H" level.

At a timing T3 after the inter-selector delay time further passes subsequent to the timing $T_2$, the "L" level in the outputs of the selectors 7a–7b is transferred to the outputs of the selectors 7b–7c in the respective rear stages, the "H" level in the in the outputs of the selectors 7c–7e is transferred to the outputs of the selectors 7d–7f in the respective rear stages, and the reception enable signal Sren continuously outputs the "H" level.

At a timing $T_4$ after the inter-selector delay time $\tau_3$ further passes subsequent to the timing T3, the "L" level in the outputs of the selectors 7a–7c is transferred to the outputs of the selectors 7b–7d in the respective rear stages, the "H" level in the outputs of the selectors 7d–7e is transferred to the outputs of the selectors 7e–7f in the respective rear stages, and the reception enable signal Sren continuously outputs the "H" level.

At a timing $T_5$ after the inter-selector delay time $\tau_3$ further passes subsequent to the timing $T_4$, the "L" level in the outputs of the selectors 7a–7d is transferred to the outputs of the selectors 7b–7e in the respective rear stages, the "H" level in the output of the selector 7e is transferred to the output of the selector 7f in the rear stage, and the reception enable signal Sren continuously outputs the "H" level.

At a timing $T_6$ after the inter-selector delay time $\tau_3$ further passes subsequent to the timing $T_5$, the "L" level in the outputs of the selectors 7a–7e is transferred to the outputs of the selectors 7b–7f in the respective rear stages, and the reception enable signal Sren shifts from the "H" level to the "L" level, though the output thereof is delayed by the delay time of the buffer 8. Thereafter, the reception enable signal Sren results in the consecutive data at the "L" level until the next transfer-start instruction signal Si is inputted.

As described, the serial transfer of the "H" level in conjunction with the serial connection of the selectors 7a–7f is realized based on the delayed action caused by the inter-selector delay time $\tau_3$ in the same manner as in the serial transfer of the data strings D0–D4 in the serial transmission circuit 10. It is the serial transfer, not by means of the transfer clock, but through utilizing the delayed action included in the serial transmission circuit itself.

As a result of the foregoing process, the reception enable signal Sren is a signal having a predetermined width, which, when the delay time of the buffer 8 is set to be τb, rises at the timing $T_1$+τb and falls at the timing $T_6$+τb. The "H" level period of the reception enable signal Sren precisely corresponds to the period when the serial data D0–D4 are outputted from the buffer 8.

In the description above, the selector 7f as the transfer gate selects the "L" level when the transmission enable signal Ssen is in the negated state at the "H" level, and correspondingly, the first-stage selector 7a selects the "L" level when the transmission enable signal Ssen is in the asserted state at the "L" level, so that the reception enable signal Sren during the period when the data is not transferred is settled to be the consecutive data at the "L" level and prevent any erroneous data from being transferred during the non-transfer period.

Referring to the reception enable signal Sren, the settled data string can be the consecutive data at the "L" level. In that case, the selector 7f as the transfer gate selects the "H" level when the transmission enable signal Ssen is in the negated state, and the first-stage selector 7a accordingly selects the "H" level when the transmission enable signal Ssen is in the asserted state. In that case, logics of the selectors 4a and 4f of the serial transmission circuit 10 and logics of the selectors 7a and 7f of the second serial transmission circuit 20 can be reversed relative to each other. In the case of the configuration that the selectors 7a and 7f select the "H" level when the transmission enable signal Ssen is in the asserted state, the ground-side "L" level is applied to the upper-side terminals selected when the transmission enable signal Ssen is in the negated state. The transmission enable signal Ssen can be active low instead of active high.

In the data transfer apparatus described above, during the period when the serial data D0–D4 are outputted, the precisely corresponding reception enable signal Sren can be synchronously generated and outputted. When the reception enable signal Sren is transmitted to the reception side together with the serial data D0–D4, a serial/parallel conversion for reception can be advantageously executed on the reception side.

Embodiment 4

Referring to FIGS. 4A and 4B, a data transfer apparatus according to an embodiment 4 of the present invention is described. The embodiment 4 is a modification of the embodiment 3, in which latches as data retaining circuits are further provided.

A serial transmission circuit 10 according to the embodiment 4 has the same configuration as the one in the embodiment 2, except for the number of data transfer, which is increased by one bit in the case of the serial transmission circuit 10 according to the embodiment 4. Selectors range from 4a to 4f, and latches range from 6a to 6f.

In a second serial transmission circuit 20, a plurality of selectors 7a–7f and a plurality of latches 9a–9f are serially connected in the state that they are alternately disposed. The power-supply-potential "H" level is connected to "H" level inputs of the selectors 7a–7e. Respective outputs of the selectors 7a–7e are connected to "L" level inputs of the selectors 7b–7f in the respective rear stages via latches 9a–9e. An "L" level input of the first-stage selector 7a and an "H" level input of the selector 7f as the transfer gate are connected to the ground-side "L" level. An output of the selector 7f is connected to a buffer 8 via a latch 9f. Respective outputs of the latches 9a–9e are connected to the "L" level inputs of the selectors 7b–7f in the respective rear stages. An output of the final-stage latch 9f is connected to the the buffer 8. The total number of the selectors 7a–7f is identical to the total number of the selectors 4a–4f in the serial transmission circuit 10. The selectors 7a–7f are serially connected with the latches 9a–9e interposed therebetween. The transmission enable signal Ssen', which is active low, is provided for gate inputs of the latches 9a–9f.

The selectors 7a–7f select and output signals of the upper-side "H" level inputs when the data set signal DS is in the asserted state at the "H" level, and select and output signals of the lower-side "L" level inputs when the data set signal DS is in the negated state. More specifically, when the data set signal DS is in the asserted state, the selectors 7a–7e select the power-supply-potential "H" level, while the selector 7f as the transfer gate selects the ground-side "L" level. When the data signal DS is in the negated state, the first-stage selector 7a selects the ground-side "L" level, while the selectors 7b–7f select the outputs of the latches 9a–9e in the respective preceding stages.

The operation of the serial transmission circuit 10 in the above data transfer apparatus is as shown in FIG. 4B. As is clear from the comparison of FIGS. 4B and 3B, the operation of the serial transmission circuit 10 according to the embodiment 4 is basically the same as the operation according to the embodiment 1. The operation of the serial transmission circuit 20 according to the embodiment 4 is basically the same as the operation according to the embodiment 3.

As described, the serial transfer at the "H" level in conjunction with the serial connection of the selectors 7a–7f and latches 9a–9f is realized based on the delayed action caused by the inter-selector delay time $\tau_4$ as in the serial transfer of the data strings D0–D4 in the serial transmission circuit 10. It is the serial transfer, not by means of the transfer clock, but through utilizing the delayed action included in the second serial transmission circuit itself.

In the data transfer apparatus according to the embodiment 4, during the period when the serial data D0–D4 are outputted, the precisely corresponding reception enable signal Sren can be synchronously generated and outputted. When the reception enable signal Sren is transmitted to the reception side together with the serial data D0–D4, the serial/parallel conversion for reception can be advantageously executed on the reception side.

Embodiment 5

Referring to FIGS. 5A and 5B, a data transfer apparatus according to an embodiment 5 of the present invention is described. The data transfer apparatus according to the embodiment 5 generates, in place of the consecutive data at the "H" level, a reception enable signal Sren' according to a clock format, wherein logics are alternated in the manner of "H", "L", "H", "L". A serial transmission circuit 10 according to the embodiment 5 shown in FIG. 5A has the same configuration as the one of the embodiment 3 shown in FIG. 3.

In a second transmission circuit 20, the power-supply-potential "H" level is connected to "H" level inputs of a first group of every other selectors 7a, 7c and 7e, and the ground-side "L" level is connected "H" level inputs of a second group of every other selectors 7b, 7d and 7f. Respective outputs of the selectors 7a–7e are connected to "L" level inputs of the selectors 7b–7f in the respective rear stages. An "L" level input of the first-stage selector 7a is connected to the ground-side "L" level. An output of the selector 7f as a transfer gate is connected to a buffer 8.

The selectors 7a–7f select and output signals of the upper-side "H" level inputs when the transmission enable signal Ssen is in the negated state at the "H" level, and select and output signals of the lower-side "L" level inputs when the transmission enable signal Ssen is in the asserted state at the "L" level. More specifically, when the transmission enable signal Ssen is in the negated state, the first group of every other selectors 7a, 7c and 7e select the power-supply-potential "H" level, while the second group of every other selectors 7b, 7d and 7f select the ground-side "L" level, and when the transmission enable signal Ssen is in the asserted state, the first-stage selector 7a selects the ground-side "L" level, while the selectors 7b–7f select the outputs of the selectors 7a–7e in the respective preceding stages.

The operation of the serial transmission circuit according to the embodiment 5 is described referring to FIG. 5B.

The operation of the serial transmission circuit 10 according to the embodiment 5 is the same as the one in the embodiment 3, therefore not described here. In the present embodiment, the operation of a second transmission circuit 20 comprised of the plurality of lower-side selectors 7a–7f is described.

Immediately prior to a timing $T_1$ after the inter-selector delay time $\tau_3$ passes subsequent to the assertion of the transmission enable signal Ssen, an output of the first-stage selector 7a is retained at the power-supply-potential "H" level. An output of the second selector 7b is retained at the ground-side "L" level. An output of the third selector 7c is retained at the power-supply-potential "H" level. An output of the fourth selector 7d is retained at the ground-side "L" level. An output of the fifth selector 7e is retained at the power-supply-potential "H" level. An output of the selector 7f as the transfer gate is retained at the ground-side "L" level. In brief, the logics are alternated in the manner of "H", "L", "H", "L". The output of the selector 4f as the transfer gate is at the "L" level, therefore, the reception enable signal Sren' outputted from the buffer 8 is retained at the "L" level.

When the second serial transmission circuit 20 shifts to the serial transfer mode after the transmission enable signal Ssen is asserted, at the timing $T_1$, the "H" level of the selector 7e is outputted as the reception enable signal Sren' from the buffer 8 via the selector 7f as the transfer gate, though the output is delayed by the delay time τb of the buffer 8. Concurrently, the "H" level in the output of the first-stage selector 7a is transferred to the output of the rear-stage selector 7b, the "L" level in the output of the selector 7b is transferred to the output of the rear-stage selector 7c, the "H" level in the output of the selector 7c is transferred to the output of the rear-stage selector 7d, the "L" level in the output of the selector 7d is transferred to the output of the rear-stage selector 7e, and the "H" level in the output of the selector 7e is transferred to the output of the selector 7f as the transfer gate. The first-stage selector 7a selects the ground-side "L" level, and the output thereof shifts to the "L" level. In the serial transfer at the timing $T_1$, the selector 7f as the transfer gate, which selects the "L" level immediately prior thereto, receives the "H" level transferred from the output of the selector 7e to thereby shift the reception enable signal Sren' to the "H" level.

At a timing $T_2$ after the inter-selector delay time $\tau_3$ passes subsequent to the timing $T_1$, the delay-based serial transfer is continuously executed, and the outputs of the selectors 7b, 7c, 7d, 7e and 7f respectively shift to "L", "H", "L", "H", "L", and "H". The first-stage selector 7a continuously remain the "L" level. The reception enable signal Sren' shifts from the "H" level to the "L" level.

The same operation is thereafter repeated, and the reception enable signal Sren' thereby shifts between the "H" and "L" levels at the time intervals based on the inter-selector delay time $\tau_3$, and precisely synchronizes with the outputs of the serial data D0–D4 from the buffer 3.

From that onwards, the reception enable signal Sren' maintains the "L" level, in other words, is the consecutive data at the "L" level until the next transmission enable signal Ssen is asserted. Then, the serial transfer is completed.

As described, according to the embodiment 5, the reception enable signal Sren', which precisely corresponds to the output states of the serial data D0-D4 and is based on the clock format of the alternate logics, is synchronously generated and outputted.

Embodiment 6

Referring to FIGS. 6A and 6B, a data transfer apparatus according to an embodiment of the present invention is described. The data apparatus according to the embodiment 6 generates the reception enable signal Sren' according to the clock format, wherein the logics are alternated in the order of "H", "L", "H", "L", in place of the consecutive data at the "H" level.

A serial transmission circuit 10 shown in FIG. 6A is the same as the one shown in FIG. 4.

In a second transmission circuit 20, the power-supply-potential "H" level is connected to "H" level inputs of a first group of every other selectors 7a, 7c and 7e, while the ground-side "L" level is connected to "H" level inputs of a second group of every other selectors 7b, 7d and 7f. Respective outputs of the selectors 7a–7e are connected to "L" level inputs of the selectors 7b–7f in the respective rear stages. An "L" level input of the first-stage selector 7a is connected to the ground-side "L" level. An output of the selector 7f as a transfer gate is connected to a buffer 8.

As shown in FIG. 6B, the selectors 7a–7f select and output signals of the upper-side "H" level inputs when the data set signal DS is in the asserted state at the "H" level, and select and output signals of the lower-side "L" level inputs when the data set signal DS is in the negated state at the "L" level. More specifically, when the data set signal DS is in the asserted state, the first group of every other selectors 7a, 7c and 7e select the power-supply-potential "H" level, while the second group of every other selectors 7b, 7d and 7f select the ground-side "L" level. When the data set signal DS is in the negated state, the first-stage selector 7a selects the ground-side "L" level, and the selectors 7b–7f select the outputs of the selectors 7a–7e in the respective preceding stages.

According to the present embodiment, the reception enable signal Sren' shifts between the "H" and "L" levels at the time intervals based on the inter-selector delay time $\tau_3$, and precisely synchronizes with the outputs of the serial data D0–D4 from the buffer 3.

As described, according to the embodiment 6, the reception enable signal Sren', which precisely corresponds to the output states of the serial data D0–D4 and is based on the clock format of the alternate logics, is synchronously generated and outputted.

A serial reception circuit is hereinafter described. Embodiments 7 through 10 refer to the serial reception circuit of the data transfer apparatus. The serial reception circuit receives serial data transmitted from the serial transmission circuit and converts it into parallel data.

Embodiment 7

Figure 7A:
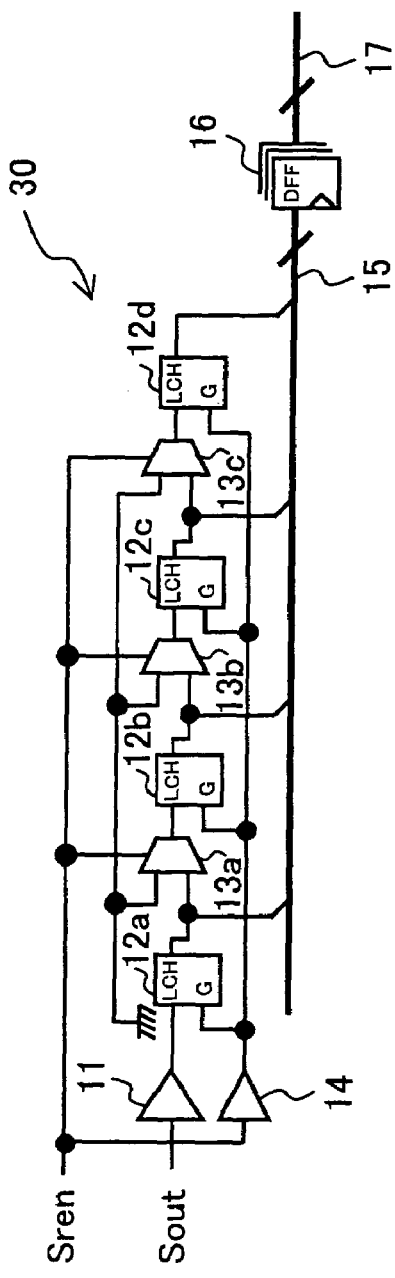
FIG. 7A is a circuit diagram illustrating a configuration of a serial reception circuit in a data transfer apparatus according to an embodiment 7 of the present invention.
Figure 7B:
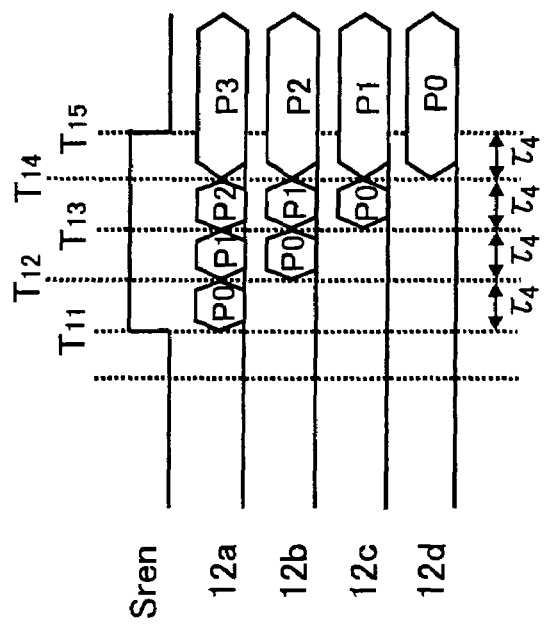
FIG. 7B is a timing chart illustrating an operation of the data transfer apparatus of FIG. 7A.

Referring to FIGS. 7A and 7B, a data transfer apparatus according to an embodiment 7 of the present invention is described. In FIG. 7A, a reference numeral 30 denotes a serial reception circuit, 11 denotes an input buffer for the serial transfer data Sout, reference symbols 12a–12d denote latches as data retaining circuits, 13a–13c denote selectors, a reference numeral 14 denotes an input buffer for a reception enable signal Sren, 15 denotes a data bus for reception, 16 denotes a group of flip-flops as transfer gates, and 17 denotes a main data bus.

An output of the input buffer 11 for the serial transfer data Sout is connected to a data input of the first-stage latch 12a. A data output of the latch 12a is connected to an "H" level input (lower side) of the first-stage selector 13a. An output of the first-stage selector 13a is connected to a data input of the latch 12b. A data output of the latch 12b is connected to an "H" level input of the selector 13b. An output of the selector 13b is connected to a data input of the latch 12c. A data output of the latch 12c is connected to an "H" level input of the selector 13c. An output of the selector 13c is connected to a data input of the latch 12d. The respective data outputs of the latches 12a–12d are connected to respective bit lines of the reception data bus 15. An output of the input buffer 14 for the reception enable signal Sren is connected to clock inputs of the latches 12a–12d. "L" level inputs of the selectors 13a–13c are connected to the ground-side "L" level. Selection terminals of the selectors 13a–13c are connected to the reception enable signal Sren. The respective bit lines of the reception data bus 15 are connected to the main data bus 17 via the group of flop-flops 16 as the transfer gates. The inter-selector delay times on the transmission and reception sides are arranged to be the same.

Referring to FIG. 7B, the operation of the serial reception circuit 30 according to the embodiment 7 is described.

The serial transfer data Sout is transmitted to the serial reception circuit 30 together with the reception enable signal Sren. The serial transfer data Sout ranges in four bits of P0–P3.

Immediately prior to the reception, the reception enable signal Sren is at the "L" level, the selectors 13a–13c select the ground-side "L" level for their "L" inputs, and all the data strings in the outputs of the latches 12a–12d are at the "L" level.

When the reception enable signal Sren is asserted, the serial reception circuit 30 shifts to a serial reception mode, and the selectors 13a–13c thereby switch over to the selection of the "H" inputs. Next, at a timing $T_{11}$ delayed by a delay time of the input buffer 14, the reception enable signal Sren at the "H" level is inputted to the clock inputs of the latches 12a–12d. Synchronously, the leading bit P0 is inputted to the first-stage latch 12a, and the value of the bit P0 is present in the output of the latch 12a, while "L" continues to be present in the outputs of the latches 12b–12d. In other words, the values of the four bits of the reception data bus 15 are P0, "L", "L", and "L". An inter-selector delay time among the adjacent selectors is set to be $\tau_4$.

At a timing $T_{12}$ after the inter-selector delay time $\tau_4$ passes subsequent to the timing $T_{11}$, the value of the bit P0 in the output of the latch 12a is transferred to the rear-stage latch 12b via the selector 13a, and the value of the next bit P1 is present in the output of the latch 12a. Concurrently, the "L" level continues to be present in the outputs of the latches 12c–12d. Then, the values of the four bits of the reception data bus 15 are P1, P0, "L", and "L".

At a timing $T_{13}$ after the inter-selector delay time $\tau_4$ further passes subsequent to the timing $T_{12}$, the value of the bit P0 in the output of the latch 12b is transferred to the rear-stage latch 12c via the selector 13b, and the value of the bit P1 in the output of the latch 12a is transferred to the rear-stage latch 12b via the selector 13a, as a result of which the value of the bit P2 is present in the output of the latch 12a. Concurrently, the "L" level continues to be present in the output of the latch 12d, and the values of the four bits of the reception data bus 15 are P2, P1, P0, and "L".

At a timing $T_{14}$ after the inter-selector delay time $\tau_4$ further passes subsequent to the timing $T_{13}$, the value of the bit P0 is present in the output of the latch 12d, the value of the bit P1 is present in the output of the latch 12c, the value of the bit P2 is present in the output of the latch 12b, and the value of the bit P3 is present in the output of the latch 12a. The values of the four bits of the reception data bus 15 are, therefore, P3, P2, P1, and P0.

Next, at a timing $T_{15}$, the reception enable signal Sren is switched over to the negated state at the "L" level, and the selectors 13a–13c select the ground-side "L" level again. A little later, the clock inputs of the latches 12a–12d are settled at the "L" level, and the outputs of the latches 12a–12d are maintained at P3, P2, P1, and P0.

Thus, the serial data transfer in accordance with the serial connection of the latches 12a–12d and selectors 13a–13c is realized based on the delayed action resulting from the inter-selector delay time $\tau_4$. It is the serial transfer, not by means of the transfer clock, but through utilizing the delayed action included in the serial transmission circuit itself.

Next, when clock inputs of the group of flip-flops 16 as the transfer gates are asserted, the data strings P3, P2, P1, and P0 on the reception data bus 15 are outputted to the main data bus 17. In brief, the serial/parallel conversion of the reception data is implemented.

In the foregoing process, when the reception enable signal Sren is in the negated state at the "L" level, the selectors 13a–13c select the ground-side "L" level, so that the parallel data during the period when the data is not transferred is settled to be the "L" level data in all the bits thereof.

The settled data in all the bits during the non-transfer period can be alternatively settled to be the "H" level data. In that case, when the reception enable signal Sren is in the negated state, the selectors 13a–13c select the power-supply-potential "H" level. Apart from that, the reception enable signal Sren can be active low instead of active high.

As described, according to the embodiment 7, the serial data transfer immediately after the reception is executed, not by synchronizing with the clock, but by utilizing the inter-selector delay time to thereby transfer the data per delay time. Therefore, it becomes unnecessary to provide the multiplier (PLL) indispensable for the conventional technology, which generates the high-speed clock essentially required for the serial transfer. Further, the disuse of the clock can achieve the reduction of the gate scale compared to the conventional technology. Thus, the present embodiment can realize an inexpensive LSI because of a reduced size of semiconductor elements resulting from the reduced gate scale, and further a corresponding reduced wiring resource for the semiconductor elements.

Embodiment 8

Referring to FIGS. 8A and 8B, a data transfer apparatus according to an embodiment 8 of the present embodiment is described. In the embodiment 8, as the reception enable signal, the reception enable signal Sren' according to the clock format, wherein the "H" and "L" levels are alternately repeated, is used.

Describing the data transfer apparatus according to the embodiment 8 referring to FIG. 8A based on a difference with respect to the embodiment 7, flip-flops 18a–18d are used in place of a combination of the latches 12a–12d and selectors 13a–13c. The flip-flop is an example of a data retaining circuit.

An output of an input buffer 11 for the serial transfer data Sout is connected to a data input of the first-stage flip-flop 18a. The flip-flops 18a–18d are serially connected. Respective data outputs of the flip-flops 18a–18d are connected to respective bit lines of a reception data bus 15. An output of an input buffer 14 for the reception enable signal Sren' according to the clock format, wherein the "H" and "L" levels are alternately repeated, is connected to clock inputs of the flip-flops 18a–18d. The respective bit lines of the reception data bus 15 are connected to a main data bus 17 via a group of flip-flops 16 as transfer gates.

Referring to FIG. 8B, the operation of a serial reception circuit 30 according to the embodiment 8.

The serial transfer data Sout is transmitted together with the reception enable signal Sren' to the serial reception circuit 30. The serial transfer data Sout range in four bits of P0–P3.

Immediately prior to the reception, the reception enable signal Sren' is settled at the "L" level, and data strings in the outputs of the flip-flops 18a–18d are all at the "L" level.

When the reception enable signal Sren' is asserted, the serial reception circuit 30 shifts to the serial reception mode.

The value of the leading bit P0 is inputted to the first-stage flip-flop 18a at a timing $T_{11}$ delayed by the delay time of the input buffer 14 in synchronization with the rise of the reception enable signal Sren', and the value of the bit P0 is present in the output of the flip-flop 18a. At the same time, the "L" level continues to be present in the outputs of the flip-flops 18b–18d. The values of the four bits of the reception data bus 15 are P0, "L", "L", and "L". An inter-selector delay time among the adjacent selectors is set to be $\tau_5$.

At a timing $T_{12}$ after the rising time $\tau_5$ of the reception enable signal based on the alternating logics passes subsequent to the timing $T_{11}$, the value of the bit P0 in the output of the flip-flop 18a is transferred to the rear-stage flip-flop 18b, and the value of the next bit P1 is present in the output of the latch 18a. At the same time, the "L" level continues to be present in the outputs of the flip-flops 18c–18d. The values of the four bits of the reception data bus 15 are then P1, P0, "L", and "L".

At a timing $T_{13}$ after the rising time $\tau_5$ of the reception enable signal based on the alternating logics passes subsequent to the timing $T_{12}$, the value of the bit P0 in the output of the flip-flop 18b is transferred to the rear-stage flip-flop 18c, and the value of the bit P1 in the output of the flip-flop 18a is transferred to the rear-stage flip-flop 18b, as a result of which the value of the next bit P2 is present in the output of the flip-flop 18a. At the same time, the "L" level continues to be present in the output of the flip-flop 18d, and therefore, the values of the four bits of the reception data bus 15 are P2, P1, P0, and "L".

At a timing $T_{14}$ after the rising time $\tau_5$ of the reception enable signal based on the alternating logics passes subsequent to the timing $T_{12}$ passes subsequent to the timing $T_{13}$, the value of the bit P0 is present in the output of the flip-flop 18d, the value of the bit P1 is present in the output of the flip-flop 18c, the value of the bit P2 is present in the output of the flip-flop 18b, and the value of the bit P3 is present in the output of the flip-flop 18a. The values of the four bits of the reception data bus 15 are, therefore, P3, P2, P1, and P0.

Next, at a timing $T_{15}$, the reception enable signal Sren' is switched over to the negated state to be thereby settled at the "L" level, and the outputs of the flip-flops 18a–18d are maintained at P3, P2, P1, and P0.

Thus, the reception enable signal Sren' received from the transmitting side is utilized as the clock signal for the serial transfer, it becomes unnecessary for the serial reception circuit 30 to utilize the multiplier (PLL) generating the high-speed clock for the serial transfer.

Next, when the clock inputs of the group of flip-flops 16 as the transfer gates are asserted, the data strings P3, P2, P1, and P0 on the reception data bus 15 are outputted to the main data bus 17, that is the implementation of the serial/parallel conversion of the reception data.

Embodiment 9

Referring to FIGS. 9A and 9B, a data transfer apparatus according to an embodiment 9 of the present invention is described. In the embodiment 8, flip-flops 18a–18d are divided into two segments as shown in FIG. 9A. The flip-flops 18a and 18c are serially connected, and the flip-flops 18b and 18d are serially connected. An output of an inversion input buffer 14a of an inversion logic is connected to an input buffer 14 for the reception enable signal Sren' according to the clock format alternately repeating the "H" and "L" levels.

A delay time of the inversion input buffer 14a is the same as a delay time of the input buffer 14. An output of the input buffer 14 for the reception enable signal Sren' is connected to the flip-flops 18b and 18c. The output of the inversion input buffer 14a is connected to the flip-flops 18a and 18c. The flip-flops 18a–18d are connected to the reception data bus 15 in the order of 18a, 18b, 18c and 18d, which is identical to the order that transfer bits are arranged. To put it differently, the every other flip-flops corresponding to the arrangement order of the transfer bits are serially connected.

Referring to FIG. 9B, the operation of a serial reception circuit 30 according to the embodiment 9 is described.

The serial transfer data Sout is transmitted to the serial reception circuit 30 together with the reception enable signal Sren'. The serial transfer data Sout ranges in four bits of P0–P3.

Immediately prior to the reception, the reception enable signal Sren' is settled at the "L" level, and data strings in outputs of the flip-flops 18a–18d are all at the "L" level.

When the reception enable signal Sren' is asserted, the serial reception circuit 30 shifts to the serial reception mode. The value of the leading bit P0 is inputted to the flip-flop 18b at the timing T11 in synchronization with the rise of the reception enable signal Sren', and the value of the bit P0 is present in the output of the flip-flop 18b. At the same time, the "L" level continues to be present in the outputs of the flip-flops 18a, 18c, and 18d. The values of the four bits of the reception data bus 15 are "L", P0, "L", and "L".

Next, at the next timing $T_{12}$, when a clock input of the flip-flop 18a is asserted in response to the fall of the reception enable signal Sren', the value of the bit P1 is present in the output of the flip-flop 18a. The values of the four bits of the reception data bus 15 are P1, P0, "L", and "L".

At the next timing $T_{13}$, the value of the bit P2 is present in the output of the flip-flop 18b and the value of the bit P0 is present in the output of the flip-flop 18d in response to the rise of the reception enable signal Sren'. The values of the four bits of the reception data bus 15 are P1, P2, "L", and P0.

A the next timing $T_{14}$, the clock input of the flip-flop 18a is asserted in response to the fall of the reception enable signal Sren'. The value of the bit P3 is present in the output of the flip-flop 18a, and the value of the bit P1 is present in the output of the flip-flop 18c. The values of the four bits of the reception data bus 15 are P3, P2, P1, and P0.

Thus, the reception enable signal Sren' received from the transmission side is utilized as the clock signal for the serial transfer, it becomes unnecessary for the serial reception circuit 30 to utilize the multiplier (PLL) generating the high-speed clock for the serial transfer.

Next, when the clock inputs of the group of flip-flops 16 as the transfer gates are asserted, the data strings P3, P2, P1, and P0 on the reception data bus 15 are outputted to the main data bus 17, that is the implementation of the serial/parallel conversion of the reception data.

As described, the present embodiment exerts the same effect as the effect achieved in the embodiment 8. Further, because the every other flip-flops are serially connected, a cycle of the reception enable signal Sren' is twice as long as in the embodiment 8, thereby increasing a temporal margin.

Embodiment 10

Referring to FIGS. 10A and 10B, a data transfer apparatus according to an embodiment of the present invention is described. The data transfer apparatus according to the embodiment 10 further comprises a counter circuit, the counter circuit obtaining a timing for data output immediately after the completion of the serial transfer for the purpose of the parallel conversion, wherein the counter circuit is driven by means of the reception enable signal.

A serial reception circuit of the data transfer apparatus according to the embodiment 10, which is shown in FIG. 10A, further comprises a counter 40 in the configuration of the embodiment 8. The counter circuit 40 serially connects flip-flops 19a–19e, and feedbacks a final-stage output to a first-stage input to thereby constitute a ring counter.

The number of flip-flops 19a–19e is identical to the number of flip-flops 18a–18e of the serial reception circuit 30. An output of an input buffer 14 for the reception enable signals Sren' is connected to clock inputs of the flip-flops 19a–19e of the counter 40.

An active-low reset signal RST is inputted to reset inputs of the flip-flops 19a–19d, and the reset signal RST is further inputted to a reset input of the final-stage flip-flop 19e. An output of the final-stage flip-flop 19e is connected to clock inputs of a group of flip-flops 16 as transfer gates via a buffer 21.

The operation of the data transfer apparatus according to the embodiment 10 is described referring to FIG. 10B.

The operation, wherein the serial transfer data Sout is received and converted into parallel data to be thereby outputted, is basically the same as in the embodiment 8.

At an optional phase prior to the reception of the serial transfer data Sout, the reset signal RST is asserted. Thereby, the "H" level is set in the final-stage flip-flop 19e, and the "L" level is set in the other flip-flops 19a–19d, that is, the flip-flops 19a–19e are respectively set in the states of "L", "L", "L", "L", and "H".

The output of the final-stage flip-flop 19e is switched over to the "L" level from the "H" level in response to a first rise of the reception enable signal Sren', and the "H" level in the final-stage flip-flop 19e immediately before the switchover is set in the first-stage flip-flop 19a. The other flip-flops 19b–19d maintains the "L" level, that is, the flip-flops 19a–19e are set in the states of "H", "L", "L", "L", and "L". A count-up signal Scnt outputted from the final-stage flip-flop 19e is inverted from the "H" level to the "L" level, and the group of flip-flops 16 as the transfer gates are thereby turned off.

In response to a second rise of the reception enable signal Sren', the "H" level in the first-stage flip-flop 19a immediately before the switchover is set in the second-stage flip-flop 19b. The other flip-flops 19a and 19c–19e are at the "L" level, that is, the flip-flops 19a–19e are respectively set in the states of "L", "H", "L", "L", and "L". The group of flip-flops 16 as the transfer gates remains the off state.

In response to a third rise of the reception enable signal Sren', the "H" level in the second-stage flip-flop 19b immediately before the switchover is set in the third-stage flip-flop 19c. The other flip-flops 19a, 19b and 19d–19e are at the "L" level, that is, the flip-flops 19a–19e are respectively set in the states of "L", "L", "H", "L", and "L". The group of flip-flops 16 as the transfer gates remains the off state.

In response to a fourth rise of the reception enable signal Sren', the "H" level in the third-stage flip-flop 19c immediately before the switchover is set in the fourth-stage flip-flop 19d. The other flip-flops 19a–19c and 19e are at the "L" level, that is, the flip-flops 19a–19e are respectively set in the states of "L", "L", "L", "H", and "L". The group of flip-flops 16 as the transfer gates remains the off state.

In response to a fifth rise of the reception enable signal Sren', the "H" level in the fourth-stage flip-flop 19d immediately before the switchover is set in the final-stage flip-flop 19e. The other flip-flops 19a–19d are at the "L" level, that is, the flip-flops 19a–19e are respectively set in the states of "L", "L", "L", "L", and "H". When the count-up signal Scnt outputted from the final-stage flip-flop 19e shifts to the "H" level to be thereby asserted, the completion of the serial transfer is confirmed.

Because the count-up signal Scnt outputted from the final-stage flip-flop 19e shifts to the "H" level, the clock inputs are provided for the groups of flip-flops 16 on the reception data bus 15 as the transfer gates, the serial transfer data Sout on the reception data bus 15, which are P0, P1, P2, P3, and P4, are transmitted to a main data bus 17, the serial/parallel conversion is implemented, and the serial transfer data is received. The outputs are stabilized by the delay of the buffer 21.

Embodiment 11

Referring to FIGS. 11A, 11B, 12A, and 12B, a data transfer apparatus according to an embodiment 11 of the present invention is described. Hereinafter, transmission and reception involving the serial transfer between a bus master circuit and a plurality of bus slave circuits are described.

As shown in FIG. 11A, a bus master circuit 100 having one each from any of the serial transmission circuits and serial reception circuits so far described, and a plurality of bus slave circuits 200 having the same configuration as the bus master circuit 100 are comprised. The serial transmission circuit of the bus master circuit 100 is connected in parallel to the respective serial reception circuits of the plurality of bus slave circuits 200. The respective serial transmission circuits of the plurality of bus slave circuits 200 are connected to the serial reception circuit of the bus master circuit 100 via an OR circuit 41. The plurality of bus slave circuits 200 respectively has receivable data lengths different to one another. For example, in the case of FIG. 11B, the bus slave circuit 200A has eight bits, the bus slave circuit 200B has 16 bits, and the bus slave circuit 200C has 32 bits, though there is no restriction to the number of receivable bits.

In the case of the bus master circuit 100, which is shared by the plurality of bus slave circuits 200 having the different receivable bit numbers, it becomes necessary to generate the transmission enable signal Ssen in compliance with the receivable bit numbers. The embodiment 11, which satisfies the request, comprises a data length supervision device supervising the receivable data lengths.

In FIG. 12A corresponding to FIG. 3, the reception enable signal Sren continuously at the "H" level is generated. In FIG. 12B corresponding to FIG. 5, the reception enable signal Sren' according to the clock format, wherein the logics are alternately repeated between the "H" and "L" levels, is generated.

Reference symbols X1–X8 denote selectors of eight bits configured in the same manner as the second serial transmission circuit 20 of FIG. 3. Reference symbols Y1–Y8 denote selectors of 8 bits configured in the same manner. Reference symbols Z1–Z16 denote selectors of 16 bits configured in the same manner. A reference symbol Y0 denotes a control selector turning on/off functions of the selectors Y1–Y8. A reference symbol Z0 denotes a control selector turning on/off functions of the selectors Z1–Z16. A reference numeral 51 denotes a selector as a transfer gate, 52 denotes a data length control register as a data length supervision device, 53 denotes a flip-flop connecting the data length control register 52 and the control selectors Y0 and Z0. The selectors X1–X8, selectors Y1–Y8, and selectors Z1–16 are all shown in the manner that the numbers of the respective selectors provided are omitted.

"H" level inputs of the selectors X1–X8 of eight bits are connected to the power-supply-potential "H" level, and "L" level inputs thereof are connected to the preceding selectors X2–X8. The selectors X1–X8 serve to generate the reception enable signal Sren for the transfer of eight-bit data.

"H" level inputs of the selectors Y1–Y8 of eight bits are connected to an output of the control selector Y0, and "L" level inputs thereof are connected to the preceding selectors Y2–Y8. The selectors Y1–Y8 function in collaboration with the selectors X1–X8, and thereby serve to generate the reception enable signal Sren for the transfer of 16-bit data.

H" level inputs of the selectors Z1–Z16 of 16 bits are connected to an output of the control selector Z0, and "L" level inputs thereof are connected to the preceding selectors Z2–Z15 and the ground-side "L" level. The selectors Z1–Z16 function in collaboration with the selectors X1–X8 and selectors Y1–Y8, and thereby serve to generate the reception enable signal Sren for the transfer of 32-bit data.

Next, the operation according to the embodiment 11 is described.

In the data length control register 52, codes for discriminating the transfer of eight-bit data, the transfer of 16-bit data, and the transfer of 32-bit data are previously set. The flip-flop 53 sequentially outputs a data length control signal from the data length control register 52 to the control selectors Y0 and Z0 in synchronization with the system clock CLK.

The transfer of eight-bit data is first described. In the case of transferring bit data, the flip-flop 53 outputs the "L" level to the control selectors Y0 and Z0, as a result of which the control selectors Y0 and Z0 both select the "L" level inputs and output the ground-side "L" level. When the transmission enable signal Ssen is in the negated state, the selectors X1–X8 select the "H" level inputs and output the power-supply-potential "H" level. The selectors Y1–Y8 and selectors Z1–Z16 respectively output the "L" level from the control selectors Y0 and Z0. However, when the transmission enable signal Ssen is in the negated state, the selector 51 as the transfer gate outputs the ground-side "L" level, therefore a buffer 8 outputs a consecutive signal at the "L" level.

When the transmission enable signal Ssen is in the asserted state, all of the selectors X1–X8, Y1–Y8 and Z1–Z16 are serially connected, and the serial transfer is executed based on the delayed action resulting from the inter-selector delay time. The output states of all of the selectors X1–X8, Y1–Y8 and Z1–Z16 are the "H" level for all of the selectors X1–X8, and the "L" level for all of the selectors Y1–Y8 and Z1–Z16. The final-stage selector Z16 outputs the ground-side "L" level. These are sequentially outputted in the form of the reception enable signal Sren from the buffer 8 via the selector 51 as the transfer gate every time a cycle of the inter-selector delay time passes. First, the first-bit "H" level is outputted. In the next cycle, the "H" level is continuously outputted, and the output of the "H" level continues until the eighth cycle. From the ninth cycle onward, the "L" level is continuously outputted. As a result, the reception enable signal Sren consecutively at the "H" level for the first eight cycles is generated and outputted.

Next, the transfer of 16-bit data is described. In the case of transferring the 16-bit data, the flip-flop 53 outputs the "H" level to the control selector Y0, and the "L" level to the control selector Z0. As a result, the selector Y0 is in the state of outputting the power-supply-potential "H" level in the "H" level input, while the control selector Z0 is in the state of outputting the ground-side "L" level in the "L" level input. When the transmission enable signal Ssen is in the negated state, the selectors X1–X8 select the "H" level inputs, and thereby output the power-supply-potential "H" level. Further, the selectors Y1–Y8 output the "H" level from the control selector Y0. The selectors Z1–Z16 output the "L" level from the control selector Z0. However, when the transmission enable signal Ssen is in the negated state, the selector 51 as the transfer gate outputs the ground-side "L" level, and the buffer 8 thereby outputs the consecutive signal at the "L" level.

When the transmission enable signal Ssen is in the asserted state, all of the selectors X1–X8, Y1–Y8, and Z1–Z16 are serially connected, and the serial transfer is executed based on the delayed action resulting from the inter-selector delay time. The output states of all of the selectors X1–X8, Y1–Y8, and Z1–Z16 are the "H" level for all of the selectors X1–X8 and Y1–Y8, and the "L" level for all of the selectors Z1–Z16. These are sequentially outputted in the form of the reception enable signal Sren from the buffer 8 via the selector 51 as the transfer gate every time the cycle of the inter-selector delay time passes. First, the first-bit "H" level is outputted. In the next cycle, the "H" level is outputted, and the output of the "H" level continues until the 16th cycle. From the 17th cycle onward, the "L" level continues. As a result, the reception enable signal Sren consecutively at the "H" level for the first 16 cycles is generated and outputted.

Next, the transfer of 32-bit data is described. In the case of transferring the 32-bit data, the flip-flop 53 outputs the "H" level to the control selectors Y0 and Z0. As a result, the control selectors Y0 and Z0 are both in the state of outputting the power-supply-potential "H" level of the "H" inputs.

When the transmission enable signal Ssen is in the asserted state, all of the selectors X1–X8, Y1–Y8, and Z1–Z16 are serially connected, and the serial transfer is executed based on the delayed action resulting from the inter-selector delay time. All of the output states of the selectors X1–X8, Y1–Y8, and Z1–Z16 are at the "H" level. The final-stage selector Z16 outputs the ground-side "L" level. Therefore, the reception enable signal Sren consecutively at the "H" level for the length of 32 cycles is generated and outputted.

In the foregoing process, the selectors may be replaced by the combination of the selectors and latches as shown in FIG. 4.

Next is described a circuit configuration shown in FIG. 12B, wherein the reception enable signal Sren' according to the clock format alternately repeating the "H" and "L" levels is generated and outputted. In a serial transmission circuit X10, a selector connected to the power-supply-potential "H" level and a selector connected to the ground-side "L" level are alternately disposed as in the second serial transmission circuit 20 of FIG. 5A. The number of selectors therein is eight. A serial transmission circuit Y10 has the same configuration. A serial transmission circuit Z10 includes 16 selectors, and the rest of the configuration is the same as the other two selectors.

A selector 54 as a transfer gate is interposed between the buffer 8 and the serial transmission circuit X10. A selector 55 as a transfer gate is interposed between the serial transmission circuit X10 and the serial transmission circuit Y10. A selector 56 as a transfer gate is interposed between the serial transmission circuit Y10 and the serial transmission circuit Z10. The selector 55 is controlled by means of the control selector Y0, and the selector 56 is controlled by means of the control selector Z0.

When the data length register 52 outputs "L", "L" and instructs the transfer of the eight-bit data, the reception signal Sren' according to the clock format alternately repeating the "H" and "L" levels for the eight cycles is generated and outputted. When the data length register 52 outputs "H", "L" and instructs the transfer of the 16-bit data, the reception signal Sren' according to the clock format alternately repeating the "H" and "L" levels for the 16 cycles is generated and outputted. When the data length register 52 outputs "H", "H" and instructs the transfer of the 32-bit data, the reception signal Sren' according to the clock format alternately repeating the "H" and "L" levels for the 32 cycles is generated and outputted.

As described, in the case of generating and outputting the reception enable signals Sren and Sren' in synchronization with the output of the serial transfer data Sout, the circuit configuration can be simplified by commonly using the bus master circuit for the serial transfers based on the different data lengths, and further, the reception enable signals Sren and Sren' having time widths corresponding to the data lengths of the serial transfer data Sout can generated.

Embodiment 12

Figure 13A:
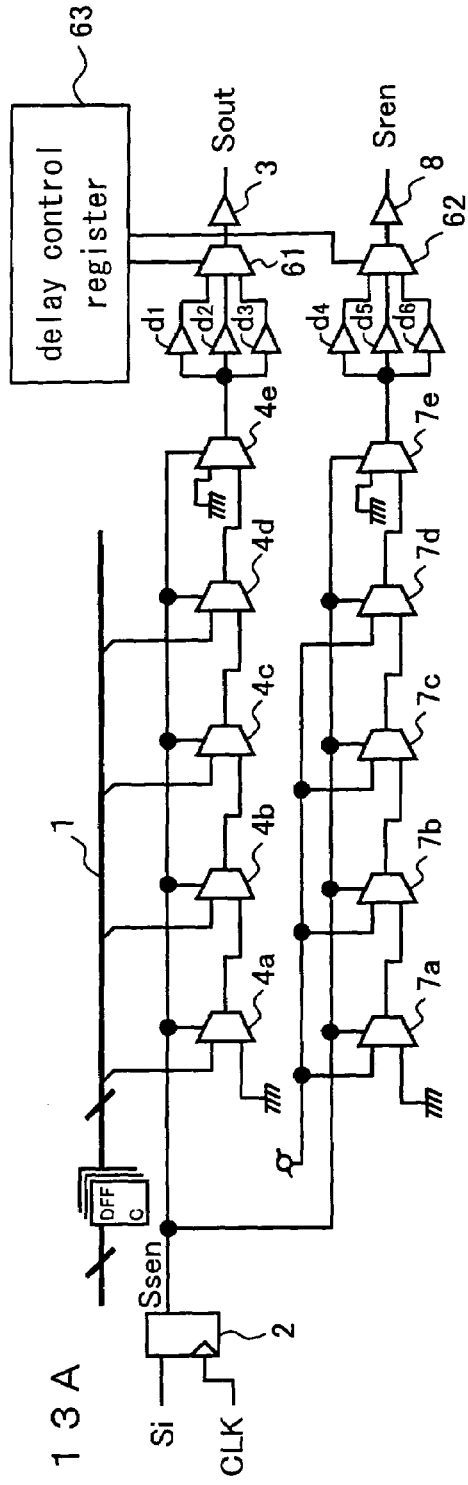
FIG. 13A is a circuit diagram illustrating a configuration of a serial transmission circuit in a data transfer apparatus according to an embodiment 12 of the present invention.
Figure 13B:
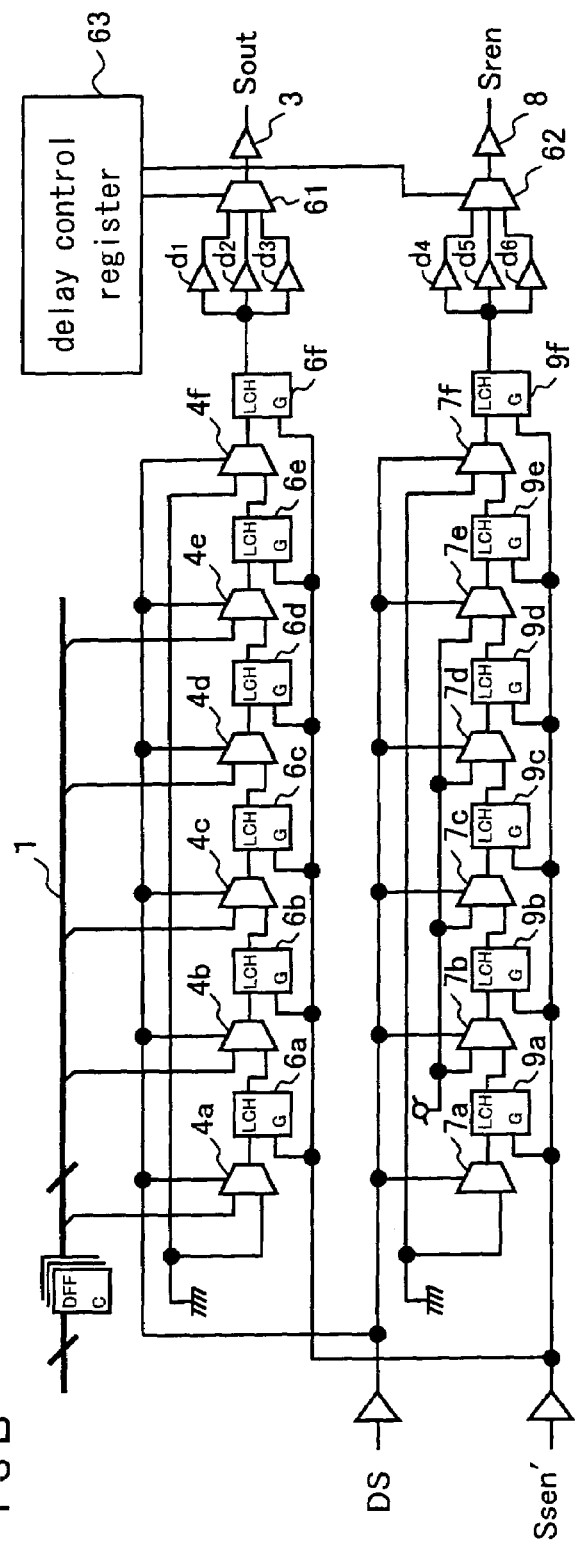
FIG. 13B is a circuit diagram illustrating a configuration of a serial transmission circuit in a data transfer apparatus according to a modification example of the embodiment 12.

Referring to FIGS. 13A and 13B, a data transfer apparatus according to an embodiment 12 of the present invention is described. The embodiment 12 deal with the problem that the different path lengths results in the different delay times in implementing the serial transfer from the commonly-used bus master 100 to the plurality of bus slave circuits 200. If the bus master circuit and the bus slave circuits are disposed distant from each other, a wiring delay, or the like, causes the delay of a serial transfer signal due to an influence from a signal integrity or the like, which occurs even in the case in which the bus master circuit and the bus slave circuits are connected in an identical stage. As a result, it may become difficult to realize the serial transfer at a stable level. To solve the problem, a register supervising the delay times of the respective bus slave circuits with respect to the reception circuit is provided to thereby change the delay times for each path length.

FIG. 13A corresponds to FIG. 3, and FIG. 13B corresponds to FIG. 4.

In FIG. 13A, a plurality of delay elements d1, d2 and d3 having delay times different to one another and connected in parallel and a delay selector 61 are inserted between an output of a selector 4e as a transfer gate and a buffer 3. Further, a plurality of delay elements d4, d5 and d6 having delay times different to one another and connected in parallel and a delay selector 62 are inserted between an output of a selector 7e as a transfer gate and a buffer 8. The delay times of the delay elements d1, d2 and d3 and the delay times of the delay elements d4, d5 and d6 are identical on principle, however, may be different where necessary.

A delay control register 63, which supervises any delay time present between the bus master circuit 100 and the respective bus slave circuits 200, is configured to control the delay selectors 61 and 62.

Depending on which bus slave circuit 200 on the other end will implement the transmission/reception, a selection signal is provided for the delay selectors 61 and 62 so that the corresponding delay element can be selected from the delay control register 63. Thereby, the most suitable delay element is selected from the plurality of delay elements d1, d2 and d3 and the plurality of delay elements d4, d5 and d6, so that the serial transfer can be implemented in the most stable manner with respect to the corresponding bus slave circuit.

On principle, the delay elements d1, d2 and d3 and the delay elements d4, d5 and d6 should be correspondingly selected at all times, however may be selected according to an optional combination where necessary. For example, when the delay element d1 is selected, any of the delay elements d4, d5 and d6 can be selected.

Embodiment 13

Figure 14:
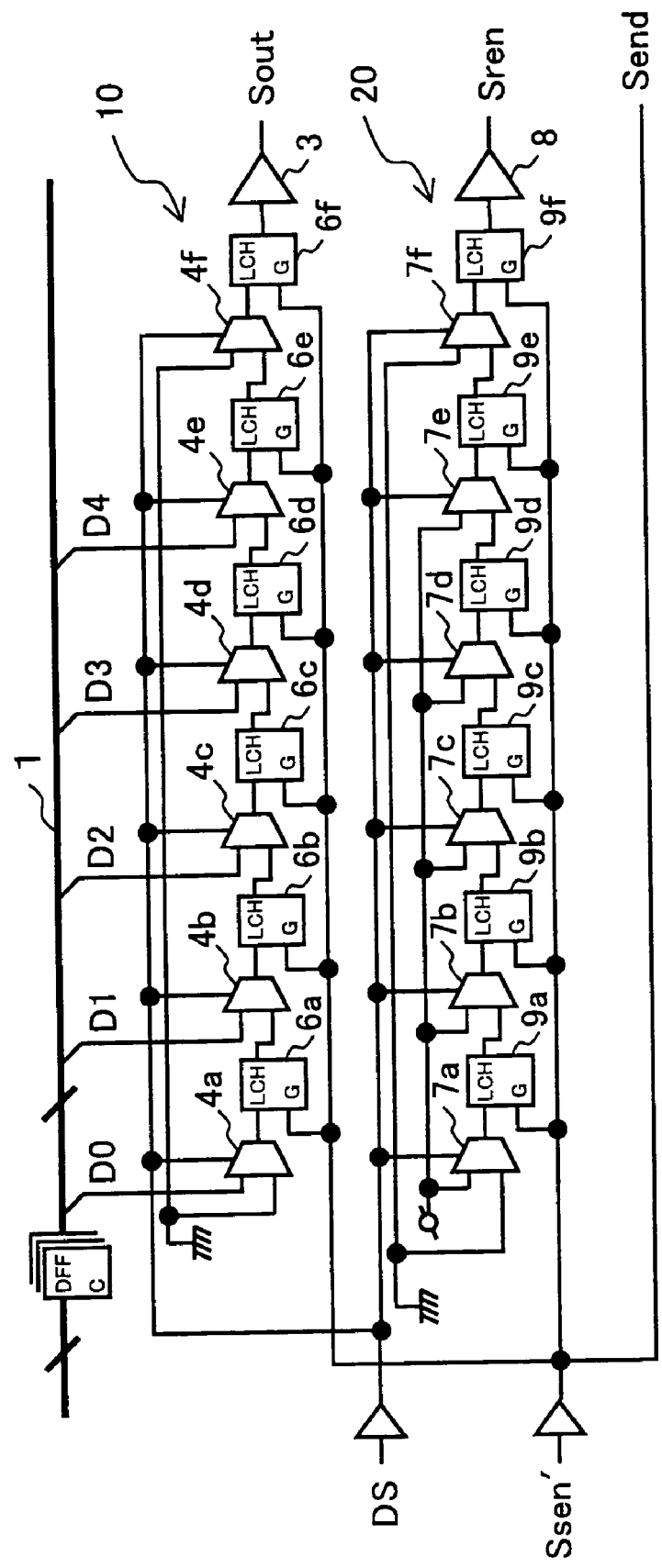
FIG. 14 is a circuit diagram illustrating a configuration of a serial transmission circuit in a data transfer apparatus according to an embodiment 13 of the present invention.
Figure 17A:
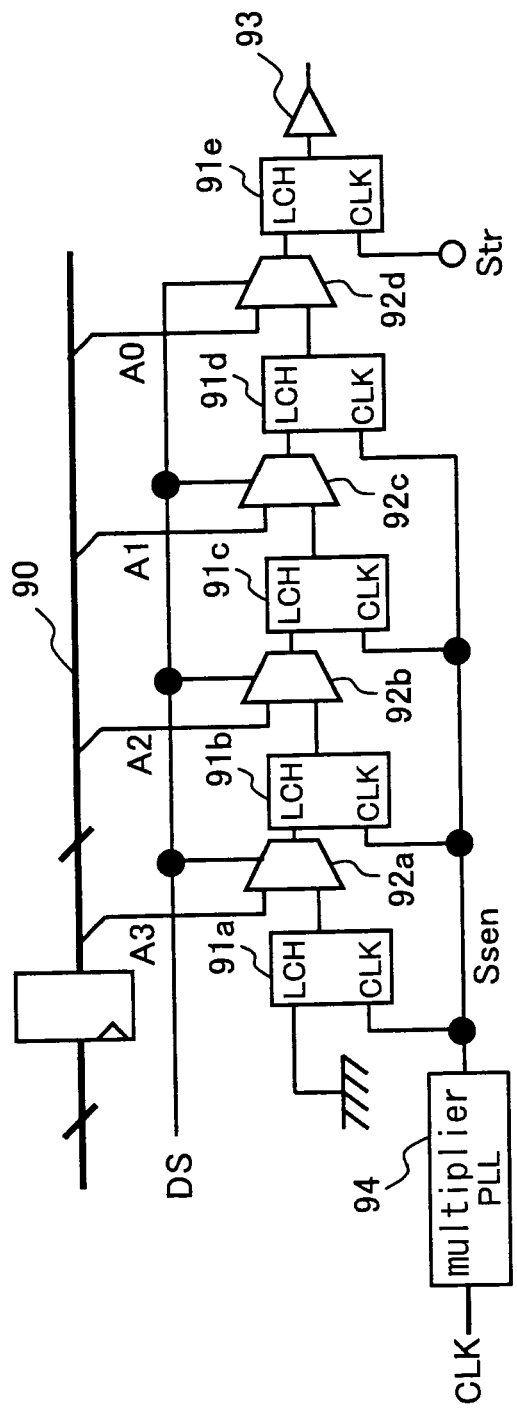
FIG. 17A is a circuit diagram of a data transfer apparatus according to a conventional technology.
Figure 17B:
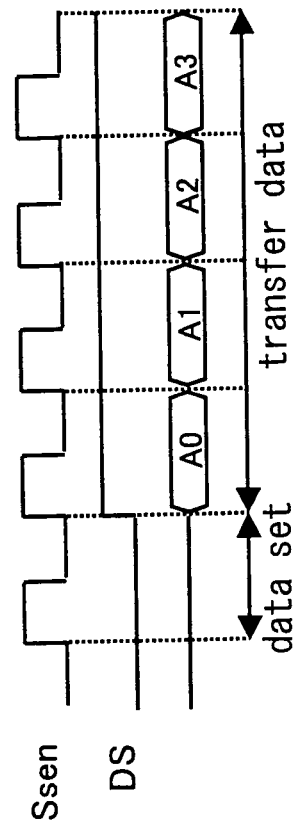
FIG. 17B is a timing chart illustrating an operation of the data transfer apparatus of FIG. 17A.

Referring to FIGS. 14, 15A and 15B, a data transfer apparatus according to an embodiment 13 of the present invention is described. FIG. 14 is a circuit diagram illustrating a configuration of a serial transmission circuit of the data transfer apparatus according to the embodiment 13, wherein a serial transfer completion signal Send is retrieved from a line of the transmission enable signal Ssen and transmitted to the reception side based on the configuration of FIG. 4 according to the embodiment 4. In other words, three signals, which are the serial transmission data Sout, reception enable signal Sren, and serial transfer completion signal Send, are synchronously transmitted.

FIG. 15 is a circuit diagram illustrating a configuration of a serial reception circuit according to the embodiment 13. Referring to FIG. 15, in the configuration of FIG. 8 according to the embodiment 8, the group of flip-flops 16 as the transfer gates are replaced by a group of flip-flops 16a as load-hold transfer gates, a flip-flop 71 for one-clock delay is provided in the preceding stage of the flip-flops 16a, the serial transfer completion signal Send is inputted to a data input of the flip-flop 71, the system clock CLK is inputted to a clock input of the flip-flop 71, and further, a load signal Sload, which is a data output of the flip-flop 71, is connected to a load hold input of the group of flip-flops 16a as the load-hold transfer gates.

In FIG. 15B, second and third lines illustrate the operation of the serial transmission circuit. Data D0 is transmitted in synchronization with the system clock CLK, and the serial transfer completion signal Send is further transmitted in synchronization with the system clock CLK.

In FIG. 15B, fourth and fifth lines illustrate the operation of the serial reception circuit, which shows a delay by a delay time from τ sr from the system clock CLK due to the delay generated between the transmission and reception.

At a timing $T_{21}$, the system clock CLK rises, however the serial transfer completion signal Send rises at a timing $T_{22}$ delayed therefrom by the delay time τ sr. Accordingly, when the serial transfer completion signal Send is provided for clock inputs of the group of flip-flops 16 as the transfer gates in response to the rise of the serial transfer completion signal Send, the fetch of the received data D0 possibly results in fail, that is, erroneous data can be received.

Therefore, the serial transfer completion signal Send is delayed by means of the flip-flop 71 by one clock of clocks to thereby generate the load signal Sload, and the signal Sload is applied to the group of flip-flops 16a as the load-hold transfer gates. The groups of flip-flops 16a as the load-hold transfer gates load the data D0 at the "L" level of the load signal Sload, and hold the data D0 at a timing when the system clock CLK rises at a next timing $T_{23}$ to thereby output the data D0 to the main data bus 17.

Thus, the fetch timing of the reception data sequentially present on a reception data bus 15 is delayed by one clock of clocks so that the reception data can be surely fetched after the reception is completed, that is, the data reception can be accurately performed.

Embodiment 14

Referring to FIGS. 16A and 16B, a data transfer apparatus according to an embodiment 14 of the present invention is described. Referring to the data transfer apparatus according to the embodiment 14, in the configuration of FIG. 8 according to the embodiment 8, the rear-end flip-flop 18*d* is replaced by a data head detection device 81, a data output of the data head detection device 81 is applied to a clock input of a flip-flop 16A via a buffer 82, and then the data output of the flip-flop 16A is applied, as a reset signal $RST_1$, to reset inputs of flip-flops 18*a*–18*d*.

Further, as shown in FIG. 16B, the serial transfer data Sout always has one bit at the "H" level appended to the head thereof.

In the process of sequentially transferring the received serial transfer data Sout, the bit at the "H" level appended to the data head arrives at the data head detection device 81 in the rear end via the flip-flops 18*a*, 18*b*, and 18*c*. At that time, all the bits of the serial transfer data Sout are outputted to a reception data bus 15 from the flip-flops 18*a*–18*c*. The "H" level of the data head outputted from the data head detection device 81 is applied to the flip-flop 16A late by a delay time $\tau_{10}$ of the buffer 82. One clock prior thereto, the "H" level from the data head is retained in the flip-flop 18*c*, therefore a data input of the flip-flop 16A is at the "H" level. Then, the flip-flop 16A outputs the "H" level in response to the application of the "H" level to a clock input thereof, which is the reset signal $RST_1$. In any line other than the first bit on a reception data bus 15, the serial transfer data Sout is collectively outputted as the parallel data to a main data bus 17 at the timing when the clock is inputted to a group of flip-flops 16. All of flip-flops 18*a*–18*c* are reset by the first-bit reset signal $RST_1$ from the flip-flop 16A immediately after the parallel output of the serial transfer data Sout, and a reception standby state for the next serial transfer data Sout arrives.

Thus, the "H" level at the data head is used for the recognition of the completion of the serial data transfer, thereby accurately performing the data reception.

While the invention has been described and illustrated in detail, it is to be clearly understood that this is intended be way of illustration and example only and is not to be taken by way of limitation, the spirit and scope of this invention being limited only be the terms of the following claims.

What is claimed is:

1. A serial data transfer apparatus comprising:
   a plurality of selectors, the plurality of selectors each having two inputs and an output; and
   a transfer gate, the transfer gate gating a transfer of data, wherein
   one inputs of the plurality of selectors are connected to respective bits of a data bus in an order that transfer bits are arranged, and the other inputs thereof are connected to the outputs of the other selectors in the order,
   the transfer gate is connected to the output of the selector in a final stage of the plurality of selectors,
   the respective corresponding bit data of the data bus are set in the plurality of selectors when a transmission enable signal is in a negated state, and the plurality of selectors and the transfer gate are connected so as to serially transfer the data when the transmission enable signal is in an asserted state, and
   the set data is serially transferred in the connecting state by means of a delayed action resulting from an inter-selector delay time, and is not controlled by a clock signal.

2. A serial data transfer apparatus comprising:
   a plurality of selectors, the plurality of selectors each having two inputs and an output;
   a plurality of data retaining circuits, the plurality of data retaining circuits respectively retaining data; and
   a transfer gate, the transfer gate gating a transfer of data, wherein
   one inputs of the plurality of selectors are connected to respective bits of a data bus in an order that transfer bits are arranged, and the other inputs thereof are respectively connected to the outputs of the other selectors via the respective data retaining circuits in the order,
   the transfer gate is connected to the output of the selector in a final stage via the data retaining circuit in the final stage, and
   the respective corresponding bit data of the data bus are set in the plurality of selectors when a data set signal is in an asserted state, and the plurality of selectors and the transfer gate are connected via the data retaining circuits so as to serially transfer the data when the data set signal is in a negated state,
   the set data is serially transferred when a transmission enable signal is applied to the data retaining circuit in the connecting state by means of a delayed action resulting from an inter-selector delay time, and is not controlled by a clock signal.

3. A serial data transfer apparatus as claimed in claim 1, further comprising a second serial transmission circuit configured in the same manner as the data transfer apparatus, wherein
   second data of an identical logical value consecutive during a transfer period representing the transfer period in place of the data on the data bus which is set for a plurality of selectors included in the second serial transmission circuit when the transmission enable signal is in the asserted state is set for the plurality of selectors included in the second serial transmission circuit when the transmission enable signal is in the negated state, and further, when the transmission enable signal is arranged to be in the asserted state, the plurality of selectors and a transfer gate of the second serial transmission circuit are connected in a manner that the second data can be serially transferred, and
   the second data is serially transferred in the connecting state as a reception enable signal by means of the delayed action caused by the inter-selector delay time.

4. A serial data transfer apparatus as claimed in claim 2, further comprising a second serial transmission circuit configured in the same manner as the data transfer apparatus, wherein
   second data of an identical logical value consecutive during a transfer period representing the transfer period in place of the data on the data bus which is set for a plurality of selectors included in the second serial transmission circuit when the transmission enable signal is in the asserted state is set for the plurality of selectors included in the second serial transmission circuit when the data set signal is in the asserted state, and further, when the data set signal is arranged to be in the negated state and the transmission enable signal is arranged to be in the asserted state, the plurality of selectors and a transfer gate of the second serial transmission circuit are connected in a manner that the second data can be serially transferred, and the second data is serially transferred in the connecting state as a reception enable signal by means of the delayed action caused by the inter-selector delay time.

5. A serial data transfer apparatus as claimed in claim 1, further comprising a second serial transmission circuit configured in the same manner as the data transfer apparatus, wherein second data of logical value alternate in the order during a transfer period representing the transfer period in place of the data on the data bus which is set for a plurality of selectors included in the second serial transmission circuit when the transmission enable signal in the asserted state is set for the plurality of selectors included in the second serial transmission circuit when the transmission enable signal is in the negated state, and further, when the transmission enable signal is arranged to be in the asserted state, the plurality of selectors and a transfer gate of the second serial transmission circuit are connected in a manner that the second data can be serially transferred, and the second data is serially transferred in the connecting state as a reception enable signal by means of the delayed action caused by the inter-selector delay time.

6. A serial data transfer apparatus as claimed in claim 2, further comprising a second serial transmission circuit configured in the same manner as the data transfer apparatus as claimed in claim 2, wherein second data of logical value alternate in the order during a transfer period representing the transfer period in place of the data on the data bus which is set for a plurality of selectors included in the second serial transmission circuit when the transmission enable signal is in the asserted state is set for the plurality of selectors included in the second serial transmission circuit when the data set signal is in the asserted state, and further, when the data set signal is arranged to be in the negated state and the transmission enable signal is arranged to be in the asserted state, the plurality of selectors and a transfer gate of the second serial transmission circuit are connected in a manner that the second data can be serially transferred, and the second data is serially transferred in the connecting state as a reception enable signal by means of the delayed action caused by the inter-selector delay time.

7. A serial data transfer apparatus comprising:

a plurality of data retaining circuits, the plurality of data retaining circuits respectively retaining data; and a plurality of selectors, the plurality of selectors each having two inputs and an output, wherein the plurality of selectors are serially connected between the plurality of data retaining circuits, a logical value is settled in one inputs of the plurality of selectors, outputs of the plurality of data retaining circuits are individually connected to respective lines of a reception data bus in an order that transfer bits are arranged, the plurality of selectors and the plurality of data retaining circuits are configured in such a manner that a reception enable signal received in synchronization with serial transfer data can be applied thereto, the plurality of selectors select the logic-settled data and set the logic-settled data in the data retaining circuits in rear stages when the reception enable signal is in a negated state, and are connected so as to serially transfer the data via the respective data retaining circuits when the reception enable signal is in an asserted state, and in the connecting state, the serial transfer data received in the data retaining circuit in a first stage is sequentially serially transferred to the data retaining circuits in the rear stages by means of a delayed action resulting from a delay time present between the adjacent selectors which is not controlled by a clock signal, and outputted from the respective data retaining circuits to the respective line of the reception data bus to be thereby converted into parallel data.

8. A serial data transfer apparatus comprising a plurality of data retaining circuits of a flip-flop type each having two inputs and an output, wherein the plurality of data retaining circuits are serially connected to each other with one inputs and the outputs thereof respectively connected, the respective outputs of the plurality of data retaining circuits are individually connected to respective lines of a reception data bus in an order that transfer bits are arranged, a reception enable signal which is generated by means of a delayed action resulting from an inter-selector delay time and not controlled by a clock signal, having alternate logical values and received in synchronization with serial transfer data generated by means of a delayed action resulting from an inter-selector delay time and not controlled by a clock signal is applied to the other inputs of the plurality of data retaining circuits, the serial transfer data generated by means of a delayed action resulting from an inter-selector delay time and not controlled by a clock signal is inputted to one of the inputs of the data retaining circuit in a first stage, the serial transfer data received in the data retaining circuit in the first stage is sequentially transferred in the data retaining circuits in rear stages in response to the alternate logical values of the reception enable signal, and the serial transfer data serially transferred is outputted from the outputs of the data retaining circuits to the respective lines of the reception data bus to be thereby converted into parallel data.

9. A data transfer apparatus as claimed in claim 8, wherein the every other data retaining circuits of the plurality of data retaining circuits are serially connected in the order to constitute a first group of serially-connected data retaining circuits and a second group of serially-connected data retaining circuits, and a transmission enable signal of a logical value inverse to a logical value of the reception enable signal applied to the first group of serially-connected data retaining circuits is applied to the second group of serially-connected data retaining circuits.

10. A data transfer apparatus as claimed in claim 8 further comprising:

a plurality of data retaining circuit apart from the plurality of data retaining circuits; and a counting device, the counting device counting data transfer numbers by means of the reception enable signal as a clock.

11. A data transfer apparatus comprising:

a bus master circuit, the bus master circuit including a first serial transmission circuit and a first serial reception circuit;

a plurality of bus slave circuits, each of the plurality of bus slave circuits including a second serial transmission circuit and a second serial reception circuit corresponding to the first serial transmission circuit and the first serial reception circuit of the bus master circuit, and the second serial reception circuits respectively having different receivable data lengths; and a data length control register, the data length control register supervising the receivable data lengths in order to generate a transmission enable signal in compliance with the receivable data lengths of the respective second serial reception circuits of the plurality of bus slave circuits with respect to the bus master circuit, wherein the respective second serial transmission circuits of the plurality of bus slave circuits are connected in parallel to the first serial reception circuit of the bus master circuit.

12. A data transfer apparatus as claimed in claim 3, wherein a plurality of delay devices respectively having different delay times are provided for an output stage of the serial transmission circuit and an output stage of the second serial transmission circuit, and the delay devices are selected in accordance with different transfer destinations.

13. A data transfer apparatus as claimed in claim 7 further comprising a delay device, the delay device transmitting a serial transfer completion signal late by at least one clock of clocks of a system clock to transfer gates implementing collective parallel output of the received data from the reception data bus to a main data bus.

14. A data transfer apparatus as claimed in claim 7, wherein the data retaining circuit in a final stage of the plurality of data retaining circuits serves as a data head detection device, and a header bit for discriminating a data head is appended to a head of the serial transfer data to thereby reset the other data retaining circuits immediately after the header bit is detected by the data head detection device.

* * * * *